(12) United States Patent
Chuang et al.

(10) Patent No.: US 10,050,050 B2
(45) Date of Patent: Aug. 14, 2018

(54) SEMICONDUCTOR DEVICE WITH METAL GATE MEMORY DEVICE AND METAL GATE LOGIC DEVICE AND METHOD FOR MANUFACTURING THE SAME

(71) Applicant: TAIWAN SEMICONDUCTOR MANUFACTURING CO., LTD., Hsinchu (TW)

(72) Inventors: Harry Hak-Lay Chuang, Singapore (SG); Wei-Cheng Wu, Zhubei (TW); Ya-Chen Kao, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 67 days.

(21) Appl. No.: 14/075,817

(22) Filed: Nov. 8, 2013

(65) Prior Publication Data

US 2015/0129952 A1 May 14, 2015

(51) Int. Cl.
| | |
|---|---|
| *H01L 29/792* | (2006.01) |
| *H01L 27/11568* | (2017.01) |
| *H01L 29/66* | (2006.01) |
| *H01L 27/11573* | (2017.01) |
| *H01L 29/423* | (2006.01) |
| *H01L 29/51* | (2006.01) |
| *H01L 21/8238* | (2006.01) |

(52) U.S. Cl.
CPC .. *H01L 27/11568* (2013.01); *H01L 27/11573* (2013.01); *H01L 29/66545* (2013.01); *H01L 21/823842* (2013.01); *H01L 29/42368* (2013.01); *H01L 29/513* (2013.01); *H01L 29/517* (2013.01)

(58) Field of Classification Search
CPC ......... H01L 27/11568; H01L 21/28282; H01L 29/792; H01L 29/42344; H01L 29/66833; H01L 21/28273; H01L 27/115; H01L 27/11573; H01L 29/42324; H01L 27/105; H01L 27/11521; H01L 27/11526; H01L 29/4234; H01L 29/66825; H01L 29/785; H01L 29/517
USPC ... 257/E29.309, E21.21, E21.679, 326, 314, 257/E21.209, E21.423, E27.081, E27.103, 257/324, 213, 20, 27, 250; 438/266, 264, 438/142, 176, 183, 195, FOR. 163, 438/FOR. 216
See application file for complete search history.

(56) References Cited

U.S. PATENT DOCUMENTS

| | | | |
|---|---|---|---|
| 8,969,940 B1 * | 3/2015 | Yater | H01L 29/42328 257/314 |
| 2003/0198086 A1 * | 10/2003 | Shukuri | B82Y 10/00 365/185.18 |
| 2008/0029822 A1 * | 2/2008 | Tsuchiya et al. | 257/369 |
| 2008/0290401 A1 * | 11/2008 | Yasui et al. | 257/324 |

(Continued)

*Primary Examiner* — Lex Malsawma
*Assistant Examiner* — Nduka Ojeh
(74) *Attorney, Agent, or Firm* — McDermott Will & Emery LLP

(57) ABSTRACT

A semiconductor device includes a substrate, at least one split gate memory device, and at least one logic device. The split gate memory device is disposed on the substrate. The logic device is disposed on the substrate. A select gate or a main gate of the split gate memory device and a logic gate of the logic device are both made of metal, and the other gate of the split gate memory device is made of nonmetal.

20 Claims, 39 Drawing Sheets

(56) References Cited

U.S. PATENT DOCUMENTS

| | | | |
|---|---|---|---|
| 2010/0283101 A1* | 11/2010 | Chen | B82Y 10/00 |
| | | | 257/325 |
| 2011/0260228 A1* | 10/2011 | Kawashima | H01L 29/4234 |
| | | | 257/298 |
| 2012/0061731 A1* | 3/2012 | Hagishima | H01L 27/11521 |
| | | | 257/204 |
| 2012/0299084 A1* | 11/2012 | Saito | H01L 21/28282 |
| | | | 257/324 |
| 2013/0032869 A1* | 2/2013 | Toh | H01L 21/28273 |
| | | | 257/314 |
| 2013/0256776 A1* | 10/2013 | Charpin-Nicolle | H01L 21/28273 |
| | | | 257/315 |
| 2014/0120713 A1* | 5/2014 | Shroff | H01L 21/28273 |
| | | | 438/593 |
| 2015/0060989 A1* | 3/2015 | Loiko | H01L 29/49 |
| | | | 257/324 |
| 2015/0206891 A1* | 7/2015 | Chuang | H01L 27/11573 |
| | | | 257/325 |

* cited by examiner

SEMICONDUCTOR DEVICE WITH METAL GATE MEMORY DEVICE AND METAL GATE LOGIC DEVICE AND METHOD FOR MANUFACTURING THE SAME

BACKGROUND

As transistors have decreased in size, the thickness of the silicon dioxide gate dielectric has steadily decreased to increase the gate capacitance and drive current and to raise device performance. As the thickness scales below 2 nm, leakage currents due to tunneling increase drastically, leading to high power consumption and reduced device reliability.

Embedding memory devices in high-κ/metal gate (HK/MG) devices can further miniaturize the combination of the HK/MG devices and the memory devices. However, because the HK/MG devices and the memory devices are formed separately, the associated process needs a lot of masks, which costs a lot. In addition, dummy structure disposed between the HK/MG devices and the memory devices is needed in such process, leading to a waste of space.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
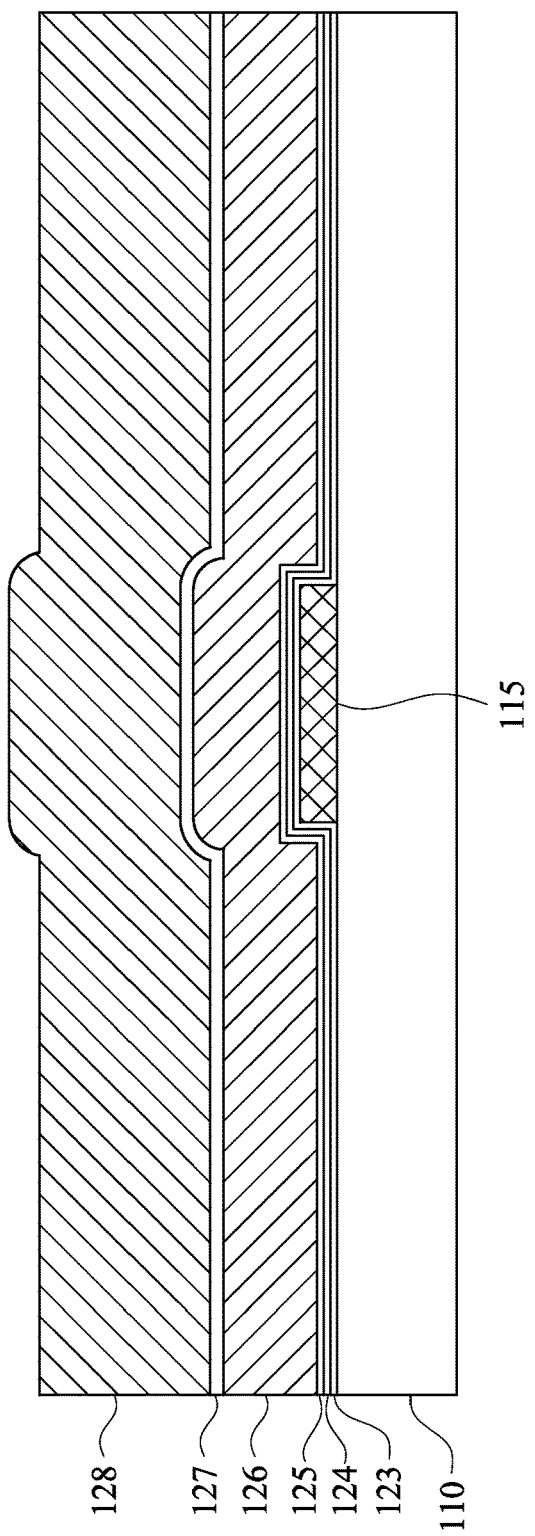
FIGS. 1 through 11 are cross-sectional views of intermediate steps in forming split gate memory devices and logic devices according to some embodiments.
Figure 2:
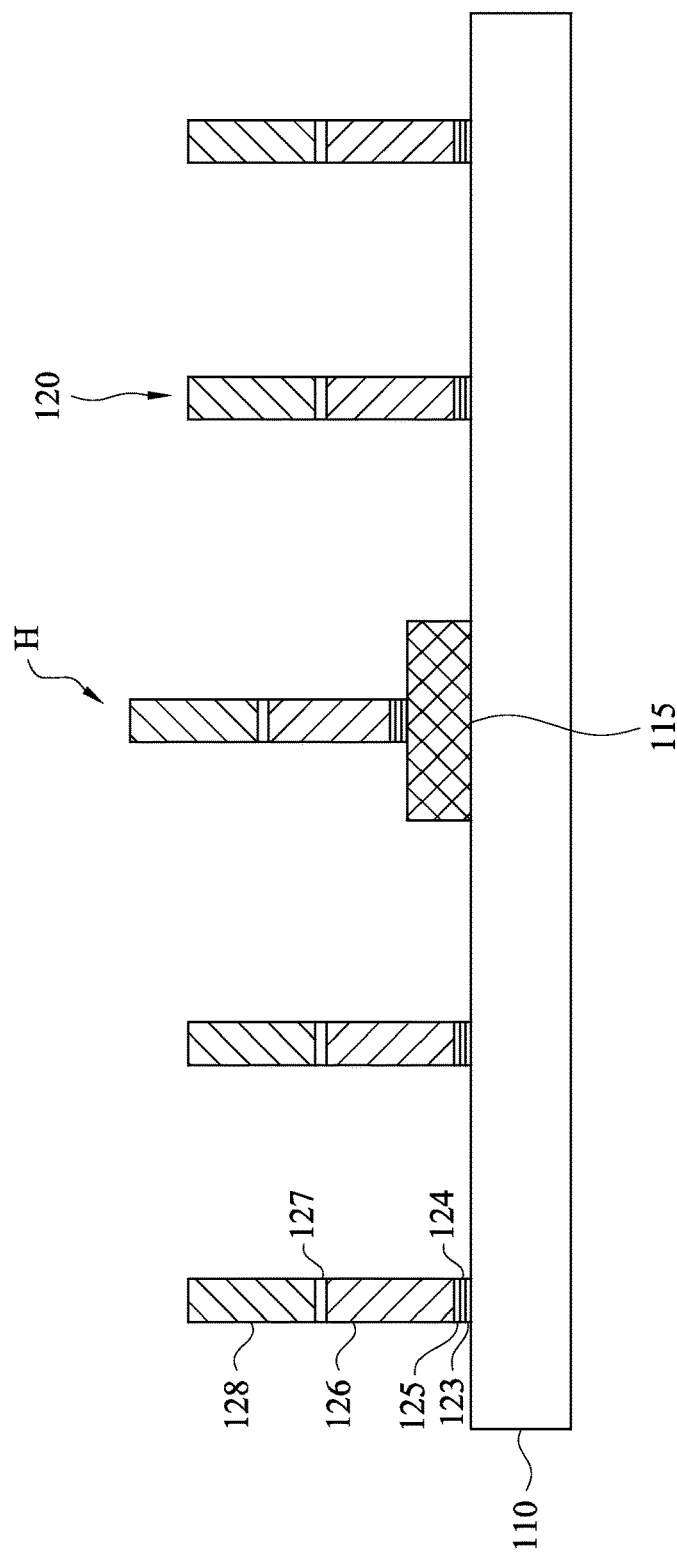

FIG. 1 through 2 are cross-sectional views illustrating gate formation according to some embodiments. As shown in FIG. 1, after the formation of high voltage oxide region 115, a core intermediate layer 123 is formed on or above a substrate 110. Then, a high-κ dielectric layer 124, a barrier layer 125, a dummy gate layer 126, a first hard mask layer 127, and an oxide layer 128 are sequentially formed on or above the core intermediate layer 123. As shown in FIG. 2, the oxide layer 128, the first hard mask layer 127, the dummy gate layer 126, the barrier layer 125, and the high-κ dielectric layer 124, and the core intermediate layer 123 are patterned to form gate stacks 120 on or above the substrate 110.

The material of the barrier layer 125 can be titanium nitride (TiN). The material of the dummy gate layer 126 can be polycrystalline silicon (Si). The material of the first hard mask layer 127 can be silicon nitride (SiN). The material of the oxide layer 128 can be silicon dioxide ($SiO_2$) or silicon oxynitride (SiON). The substrate 110 can be a semiconductor, such as silicon (Si), gallium arsenide (GaAs), or silicon-on-insulator (Sol).

Specifically, the gate stacks 120 and line-ends (not shown) are defined by at least one mask, and the gate formation is performed through a masking and deposition process. The deposition processes of this disclosure, if not specified, can be a chemical vapor deposition (CVD), a plasma enhanced chemical vapor deposition (PECVD), a physical vapor deposition (PVD), sputtering, or another deposition process.

Specifically, the thickness of the barrier layer 125 is approximately 2 nm. The thickness of the dummy gate layer 126 is approximately 68 nm. The thickness of the first hard mask layer 127 is approximately 10 nm. The thickness of the oxide layer 128 is approximately 110 nm.

Furthermore, at least one high voltage oxide region 115 is formed on or above the substrate 110. At least one of the gate stacks 120 is formed on or above the high voltage oxide region 115 as a high voltage device gate stack H.

Figure 3:
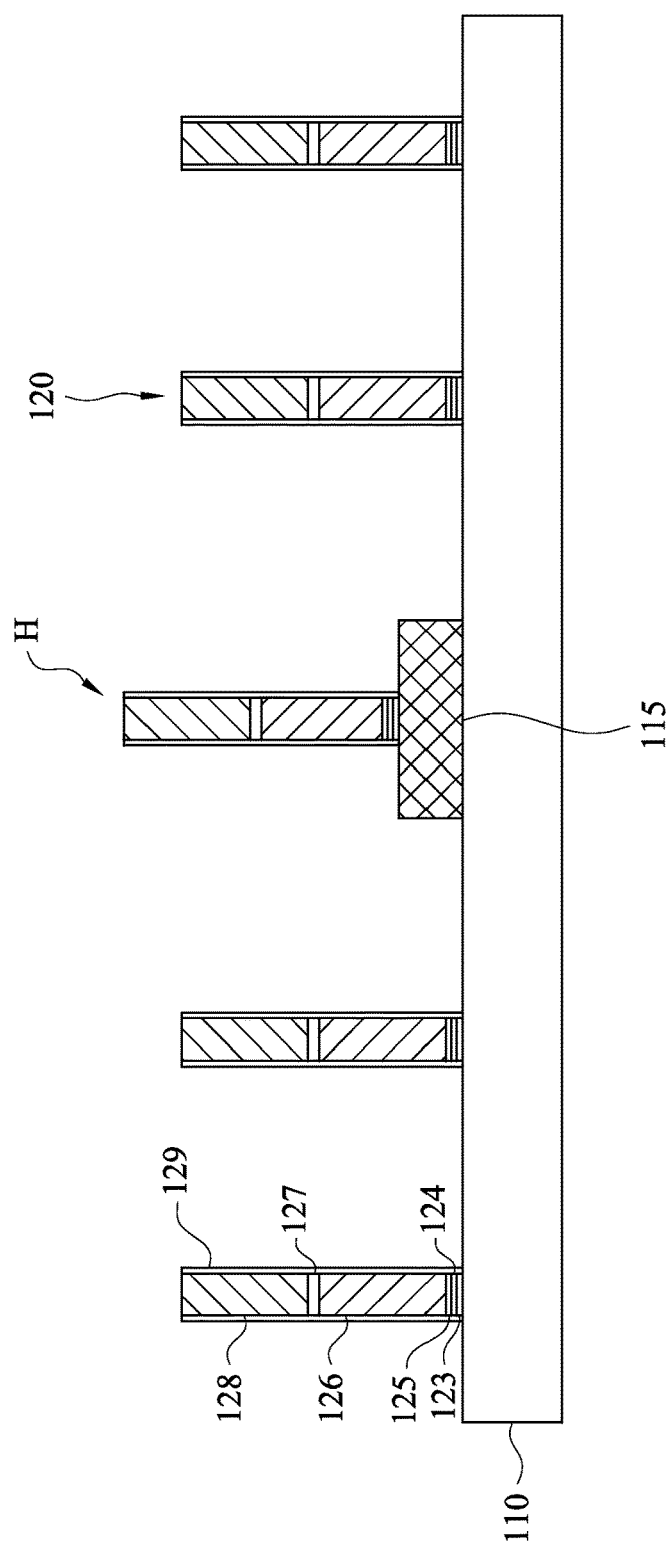

FIG. 3 is a cross-sectional view illustrating seal formation according to some embodiments. As shown in FIG. 3, a first seal layer 129 is formed around each of the gate stacks 120 and gate stack H. Specifically, a dielectric layer is formed on or above the substrate 110 and the gate stacks 120, and then the dielectric layer is anisotropically etched to form the first seal layer 129 around each of the gate stacks 120. The material of the first seal layer 129 can be silicon nitride (SiN). The thickness of the first seal layer 129 is approximately 5 nm.

Figure 4:
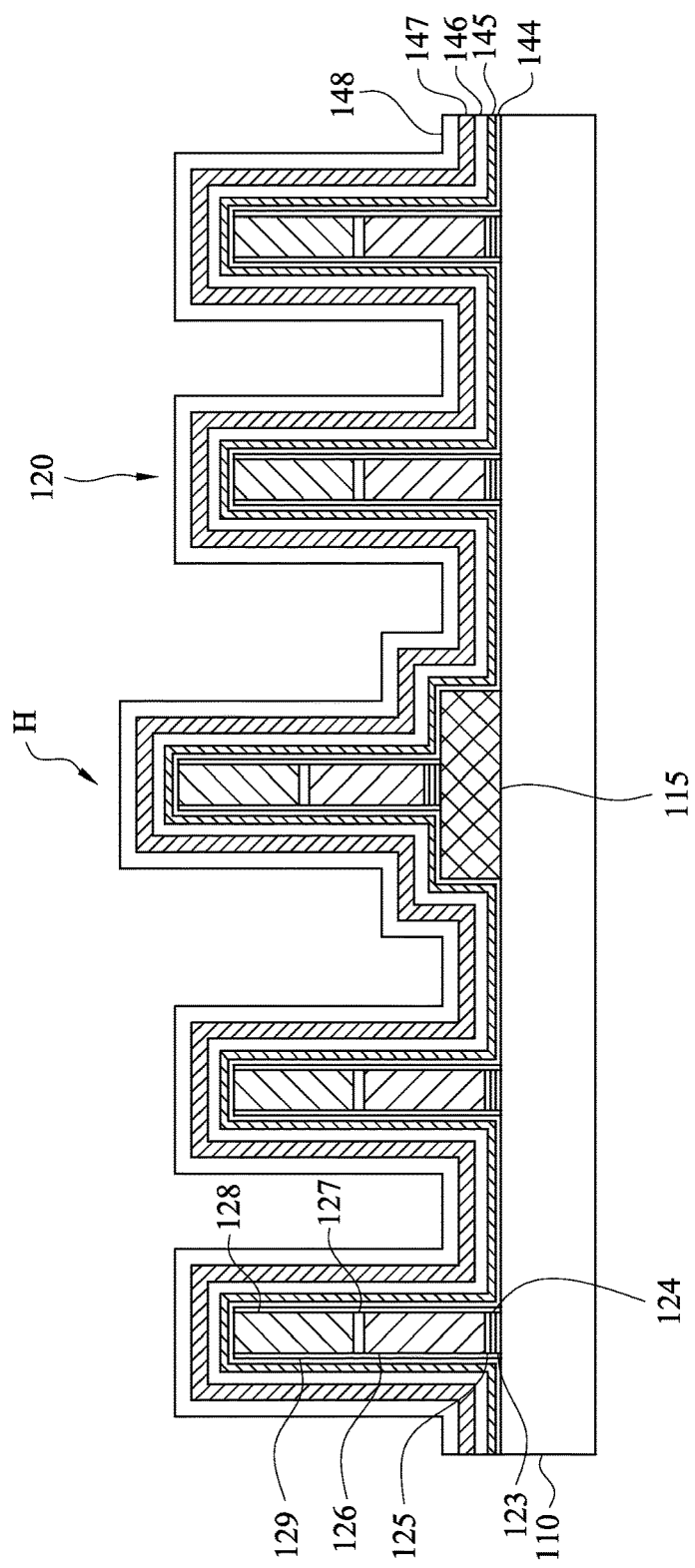

FIG. 4 through 11 is cross-sectional views illustrating device formation according to some embodiments. As shown in FIG. 4, a tunneling layer 144 is formed on or above the substrate 110 through atomic layer deposition. Then, post-nitridation annealing is performed by in situ steam generation. Then, a charge trapping layer 145 is formed on or above the tunneling layer 144. Then, a blocking layer 146 is formed on or above the charge trapping layer 145 through high temperature oxidation, and then the blocking layer 146 is annealed. Then, a main gate layer 147 is formed on or above the blocking layer 146. Then, a second hard mask layer 148 is formed on or above the main gate layer 147.

The tunneling layer 144 and the blocking layer 146 can be made of silicon dioxide ($SiO_2$) or silicon oxynitride (SiON). The material of the charge trapping layer 145 can be silicon nitride (SiN), silicon doped silicon nitride, or Silicon nanocrystal dot. The material of the main gate layer 147 can be polycrystalline silicon (Si) or metal doped polycrystalline silicon. The material of the second hard mask layer 148 can be silicon nitride (SiN).

Specifically, the thickness of the tunneling layer 144 is approximately 5 nm. The thickness of the charge trapping layer 145 is approximately 10 nm. The thickness of the blocking layer 146 is approximately 10 nm. The thickness of the main gate layer 147 is approximately 25 nm. The thickness of the second hard mask layer 148 is approximately 25 nm.

Figure 5:
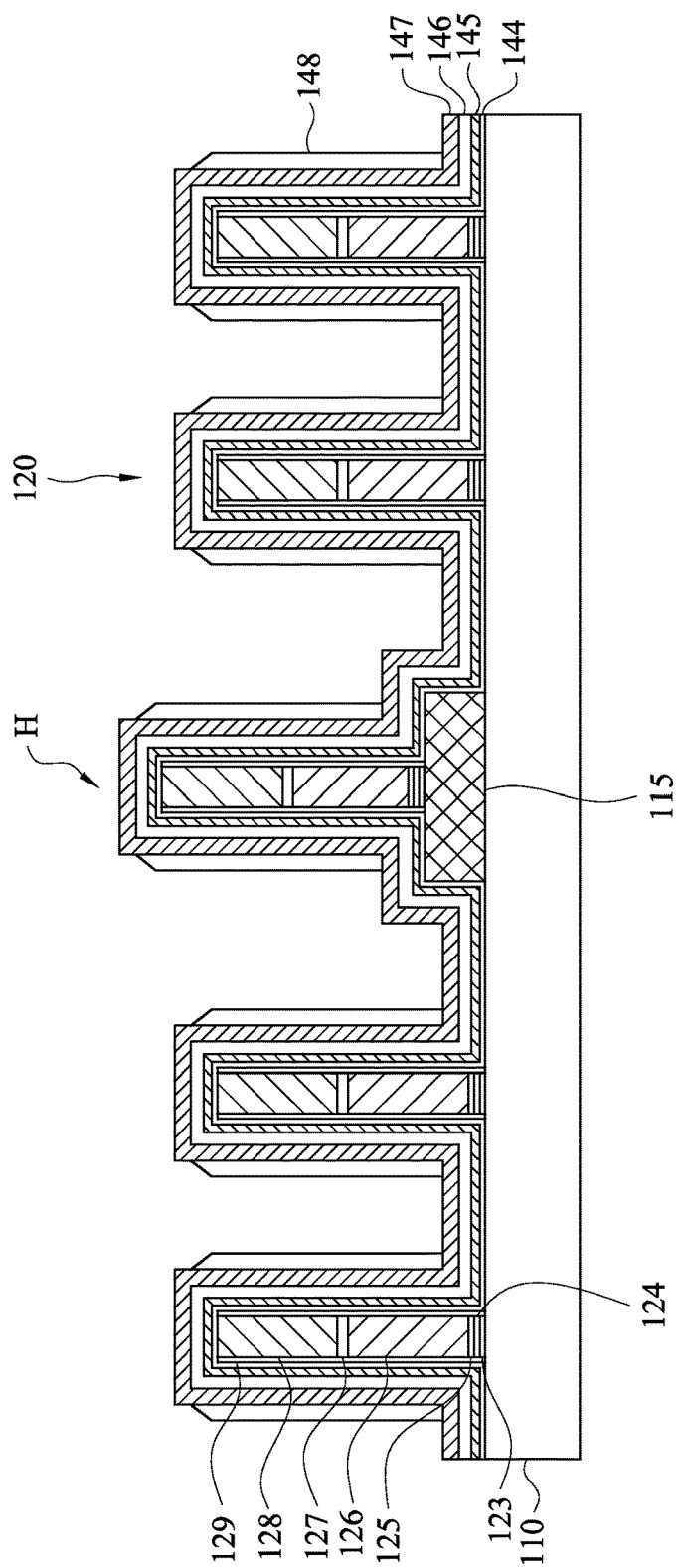
Figure 6:
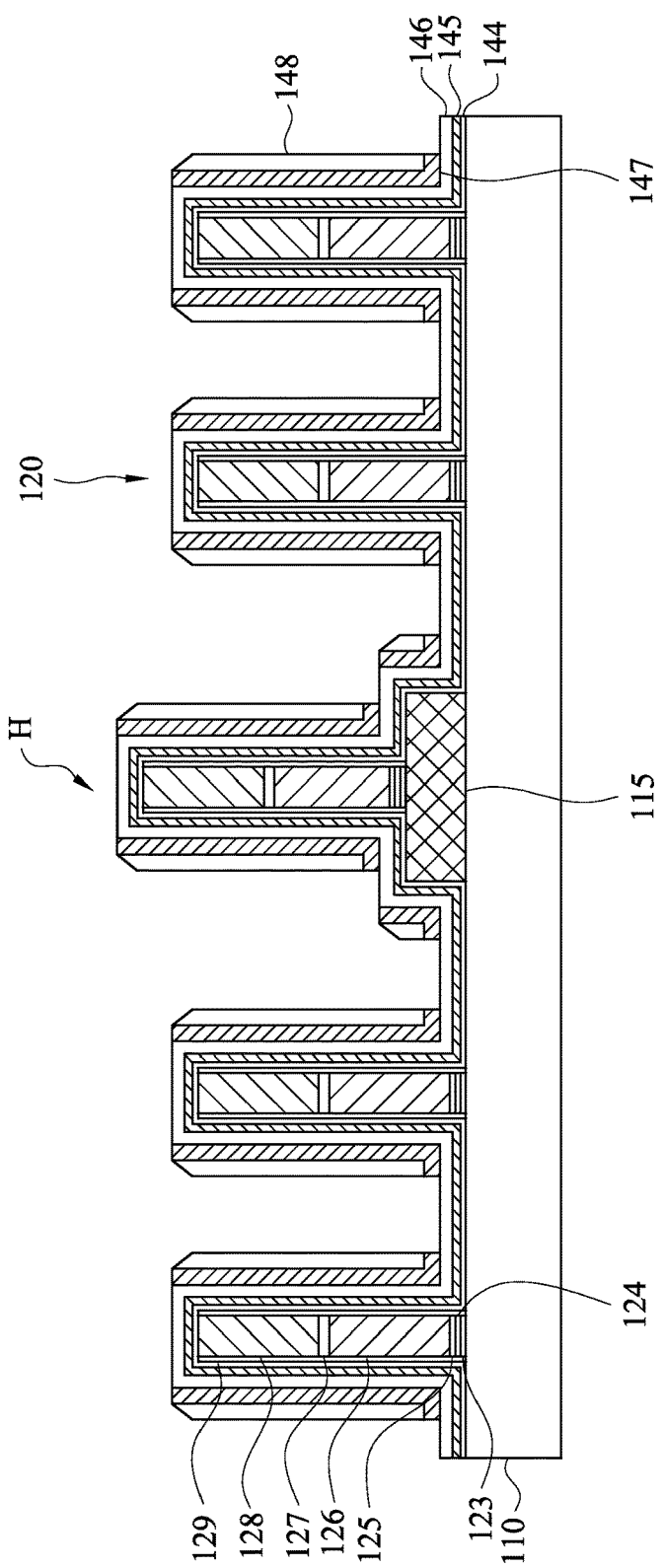

As shown in FIG. 5, the second hard mask layer 148 is etched into spacers. Then, as shown in FIG. 6, the main gate layer 147 is dry etched. Therefore, at least a part of the main gate layer 147 is disposed between the second hard mask layer 148 and the blocking layer 146.

Figure 7:
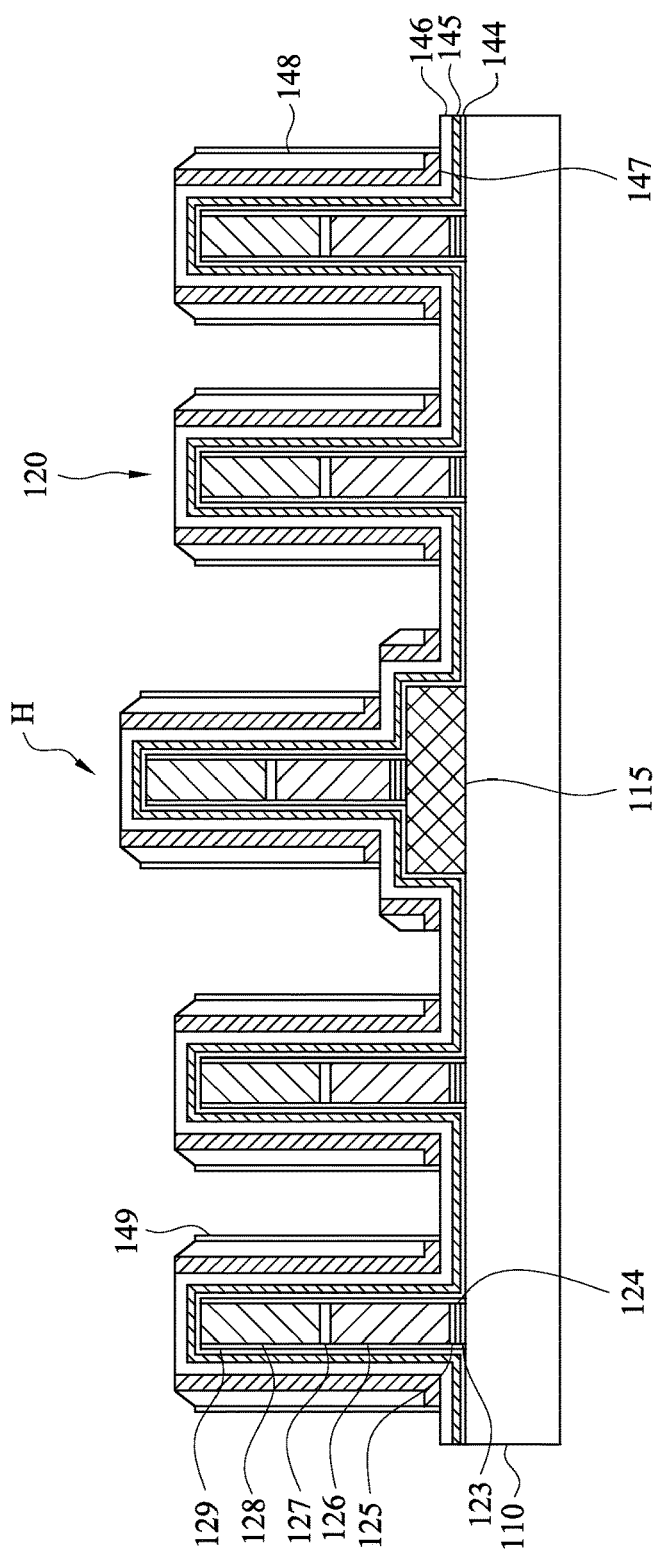

As shown in FIG. 7, a second seal layer 149 is formed adjacent to the main gate layer 147 and the second hard mask layer 148. Specifically, a dielectric layer is formed on or above the substrate 110, and then the dielectric layer is anisotropically etched to form the second seal layer 149 adjacent to the main gate layer 147. The material of the second seal layer 149 can be silicon nitride (SiN). The thickness of the second seal layer 149 is approximately 5 nm.

Figure 8:
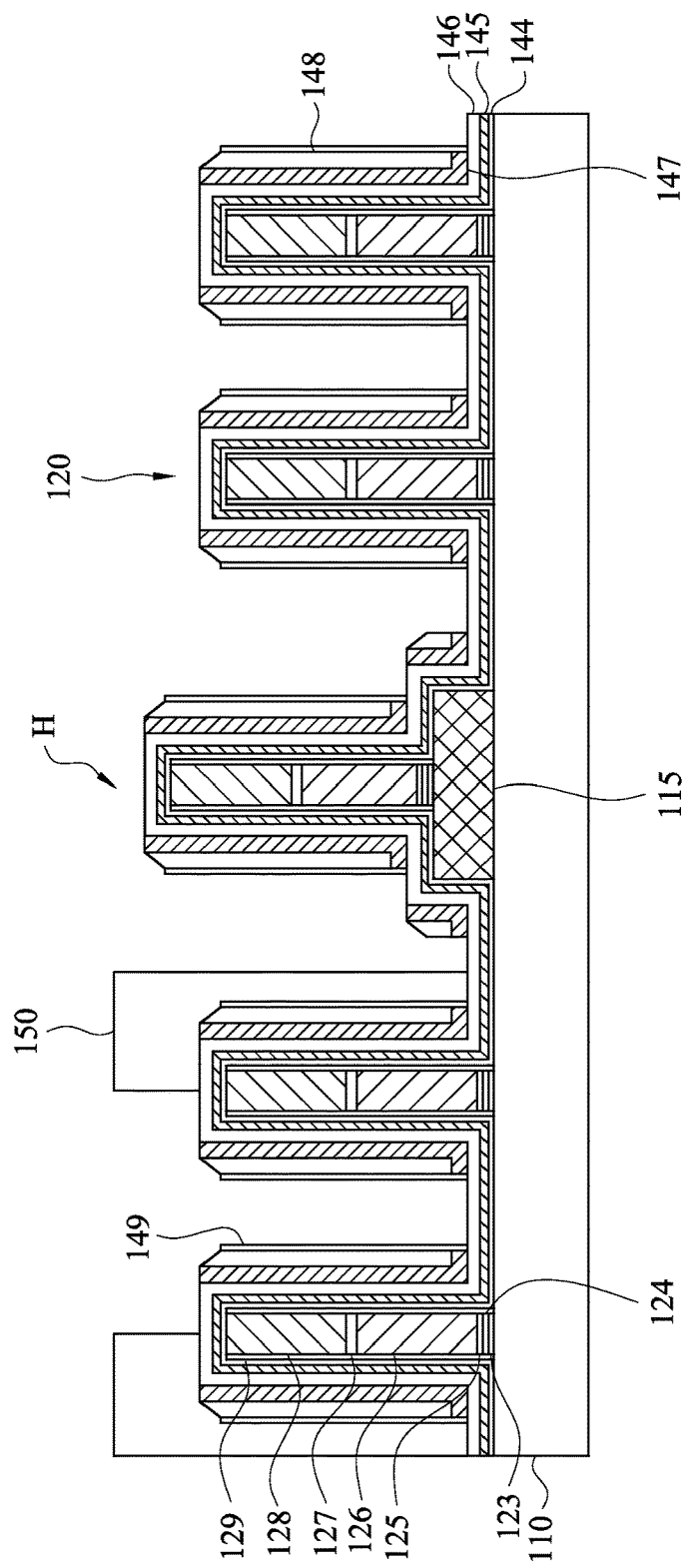
Figure 9:
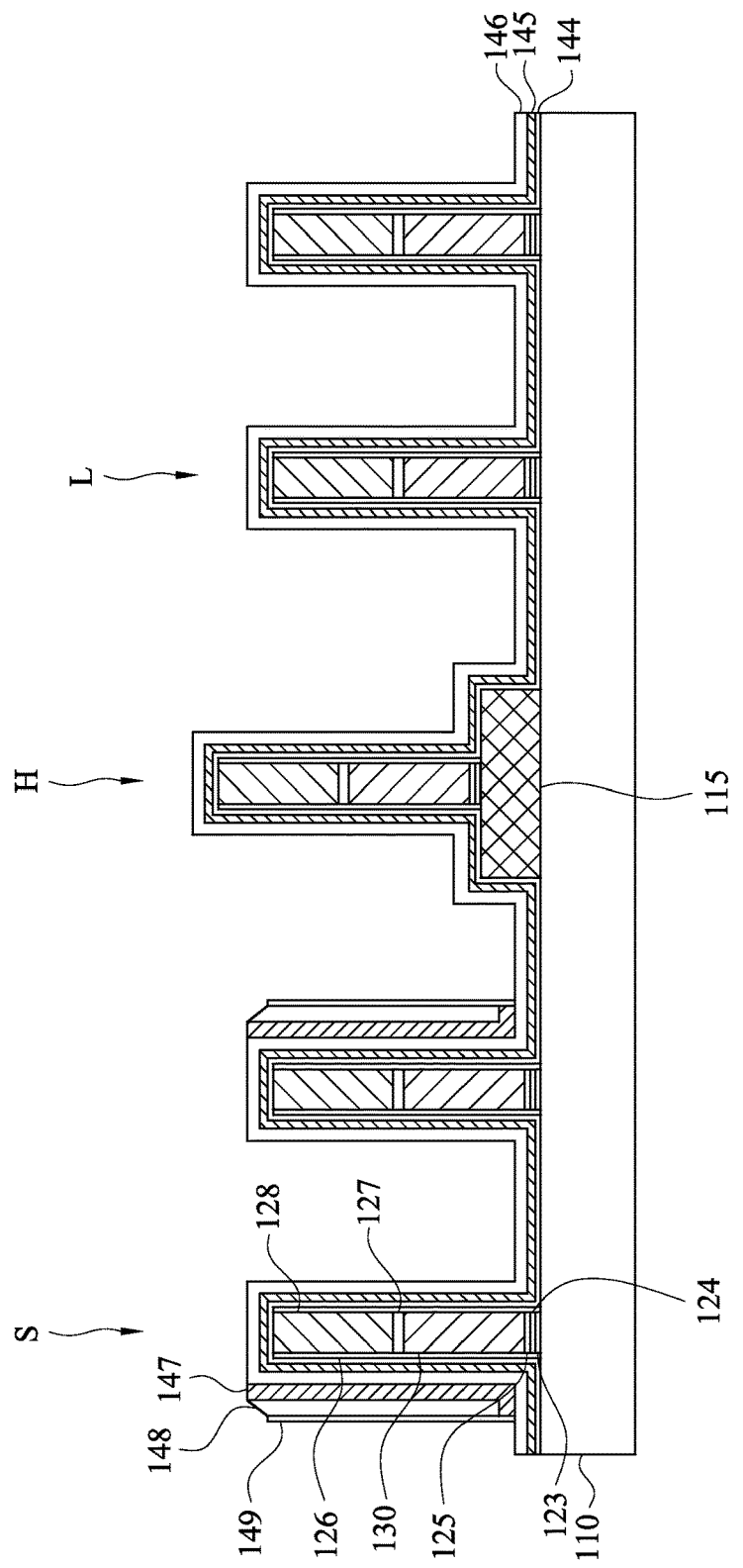

As shown in FIG. 8, a photoresist 150 is formed to define drain side regions of memory gates. Then, as shown in FIG. 9, the second seal layer 149, the second hard mask layer 148, and the main gate layer 147 outside the drain side regions is removed by chemical dry etching to transform the gate stacks 120 having the drain side regions into split gate stacks S, and the remaining gate stacks 120 can be considered logic gate stacks L. Then, the photoresist 150 is removed.

Figure 10:
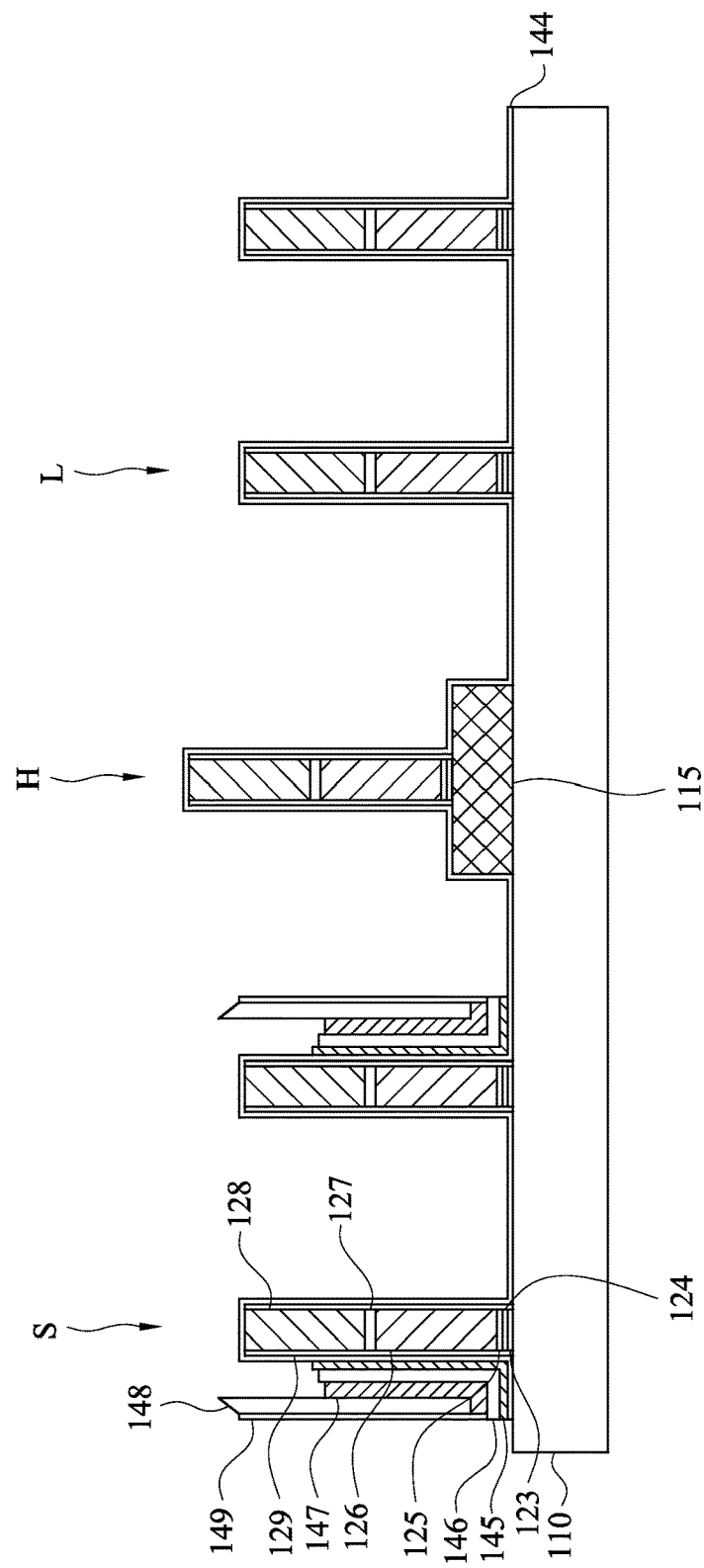
Figure 11:
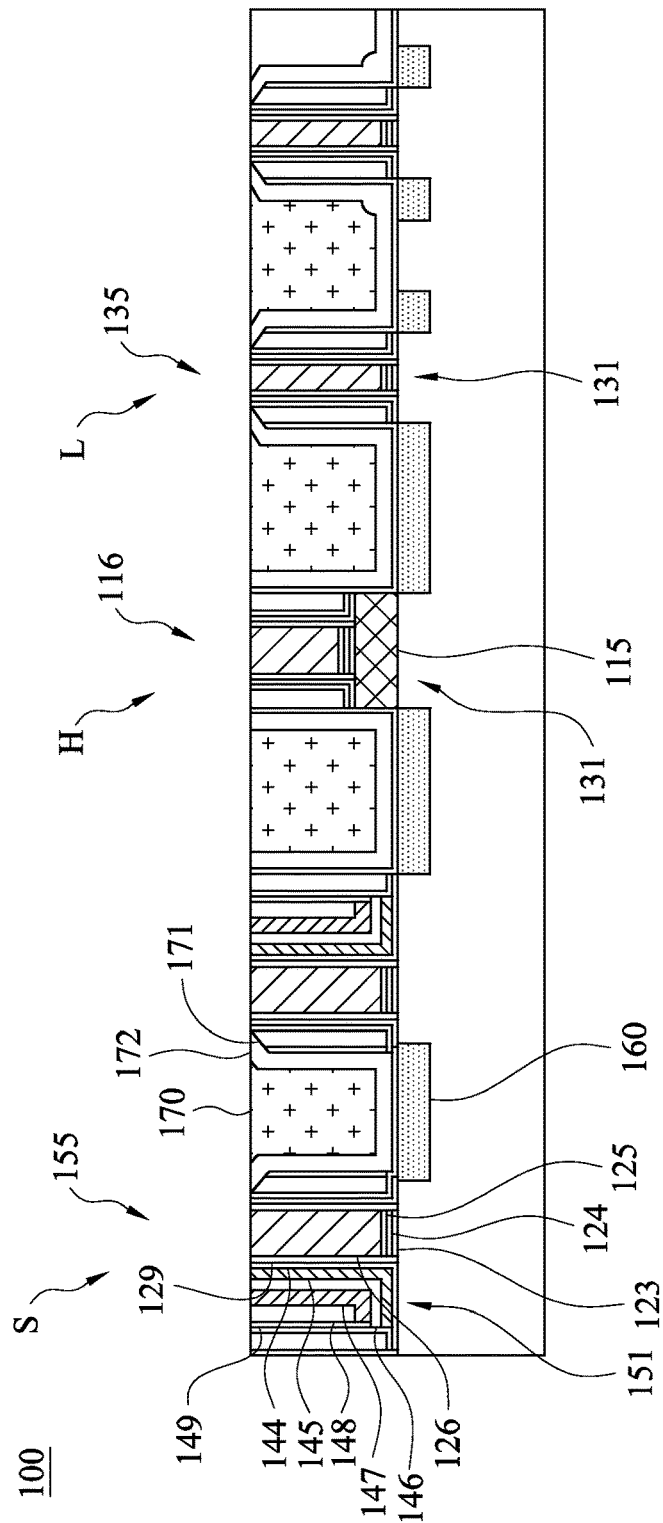

As shown in FIG. 10, the blocking layer 146 is blanketly wet dipped. The charge trapping layer 145 and the main gate layer 147 are partially removed by blanket chemical dry etching. The tunneling layer 144 is blanketly wet dipped. As shown in FIG. 11, drains 160 are implanted corresponding to the logic gate stacks L, the high voltage device gate stack H, and the split gate stacks S, such that logic devices 135, a high voltage device 116, and split gate memory devices 155 are formed. Then, a spacer layer 171 is formed around the logic gate stacks L, the high voltage device gate stack H, and the split gate stacks S. Then, a metal silicide layer 172 is formed on the drains 160. Then, an interlayer dielectric layer 170 is formed on or above the contact etch stop layer 172. Then, the semiconductor device 100 of FIG. 11 is planarized.

Specifically, at least one memory channel 151 is located under the split gate stacks S, at least one logic channel 131 is located under the high voltage stack H, and at least one logic channel 131 is located under the logic gate stacks L.

The material of the drains 160 can be germanium silicide (SiGe), silicon carbide (SiC), nickel silicide (NiSi), cobalt silicide (CoSi), and titanium silicide (TiSi). The material of the spacer layer 171 can be silicon nitride (SiN). The material of the contact etch stop layer 172 can be silicon nitride (SiN) or silicon oxynitride (SiON).

Specifically, the contact etch stop layer 172 can be formed by a physical vapor deposition (PVD), a chemical vapor deposition (CVD), or an electroless metal deposition (EMD). The person having ordinary skill in the art can make proper modification to the formation of the contact etch stop layer 172 according to their actual needs.

Specifically, the logic devices 135 can form a logic circuit such as an input/output (IO) device or a static random-access memory (SRAM). The split gate memory devices 155 can form a memory circuit such as a flash memory.

Specifically, the planarization of this disclosure, if not specified, can be chemical mechanical polishing. The person having ordinary skill in the art can make proper modification to the planarization according to their actual needs.

Specifically, the high-κ dielectric layers 124 of the split gate stacks S can now be considered select gate dielectric layers. The high-κ dielectric layers 124 of the logic gate stacks L can now be considered logic gate dielectric layers. The high-κ dielectric layer 124 of the high voltage device gate stack H can now be considered a high voltage device gate dielectric layer. The dummy gate layers 126 of the logic gate stacks L can now be considered logic gates. The main gate layers 147 of the split gate stacks S can now be considered main gates. The dummy gate layers 126 of the split gate stacks S can now be considered select gates. The dummy gate layer 126 of the high voltage device gate stack H can now be considered a high voltage device gate.

Figure 12:
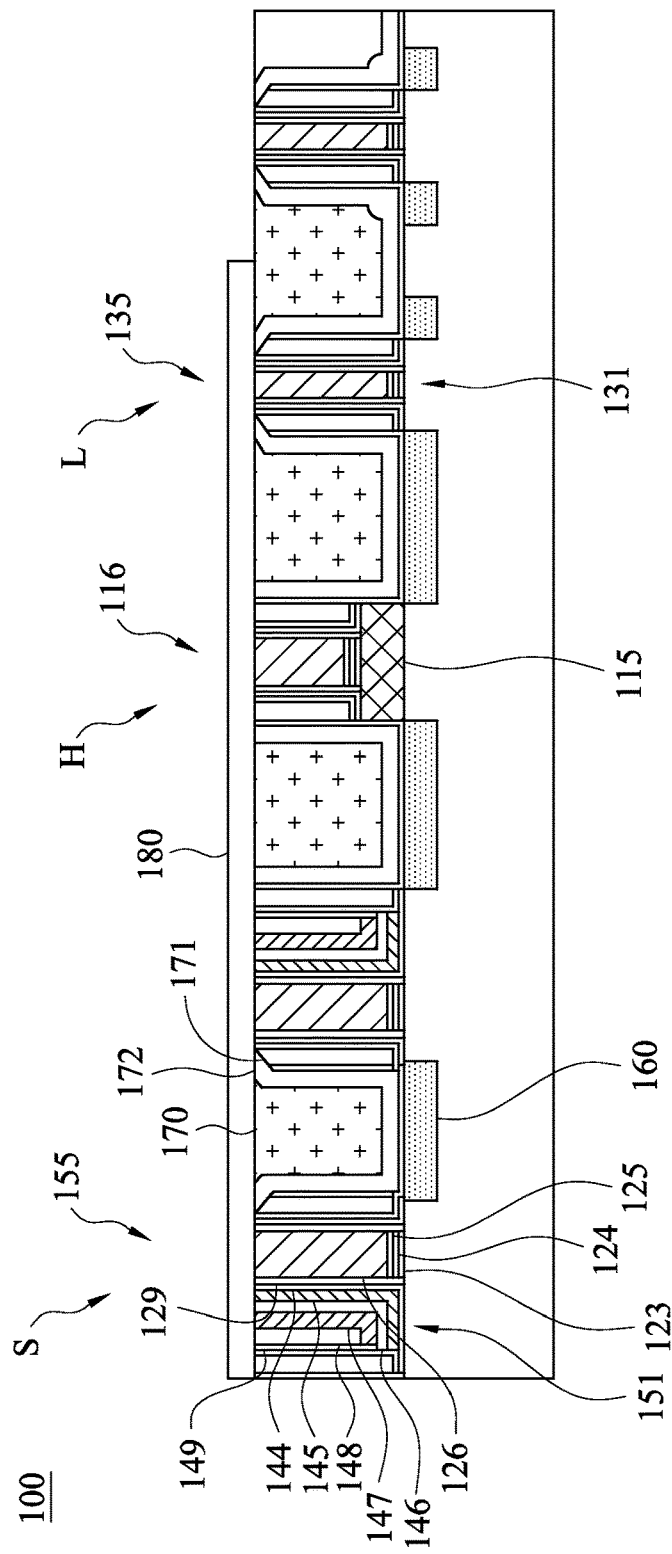
FIGS. 12 through 18 are cross-sectional views of intermediate steps in a replacement polysilicon gate (RPG) loop according to some embodiments.

FIGS. 12 through 18 illustrate cross-sectional views of intermediate steps in a replacement polysilicon gate (RPG) loop according to some embodiments. As shown in FIG. 12, a P-metal replacement mask 180 is formed on or above the semiconductor device 100 of FIG. 11. The dummy gate layer 126 of at least one of the logic devices 135 is exposed by the P-metal replacement mask 180. The material of the P-metal replacement mask 180 can be titanium nitride (TiN). The thickness of the P-metal replacement 180 can be 3 nm.

Figure 13:
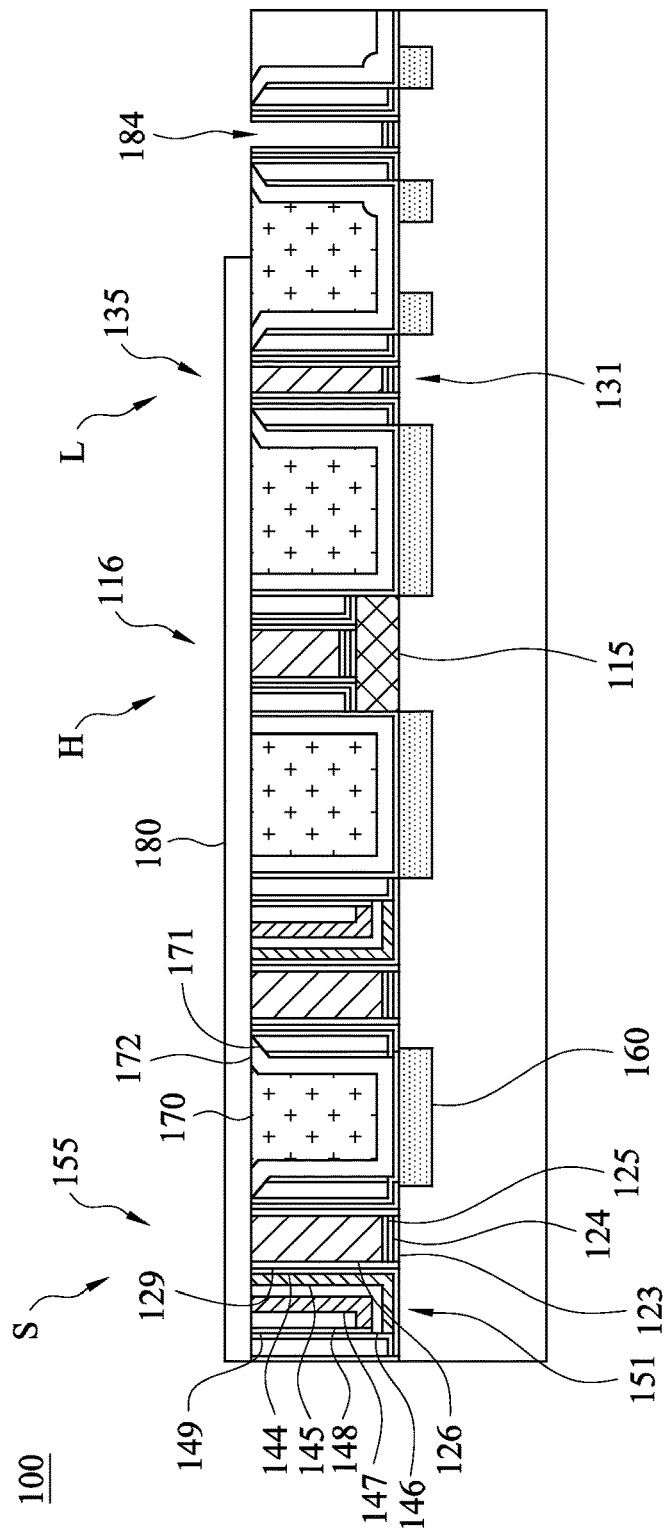

As shown in FIG. 13, the dummy gate layer 126 of at least one of the logic devices 135 is removed to form at least one P-type logic gate opening 184 in the logic devices 135, specifically the logic gate stacks L.

Figure 14:
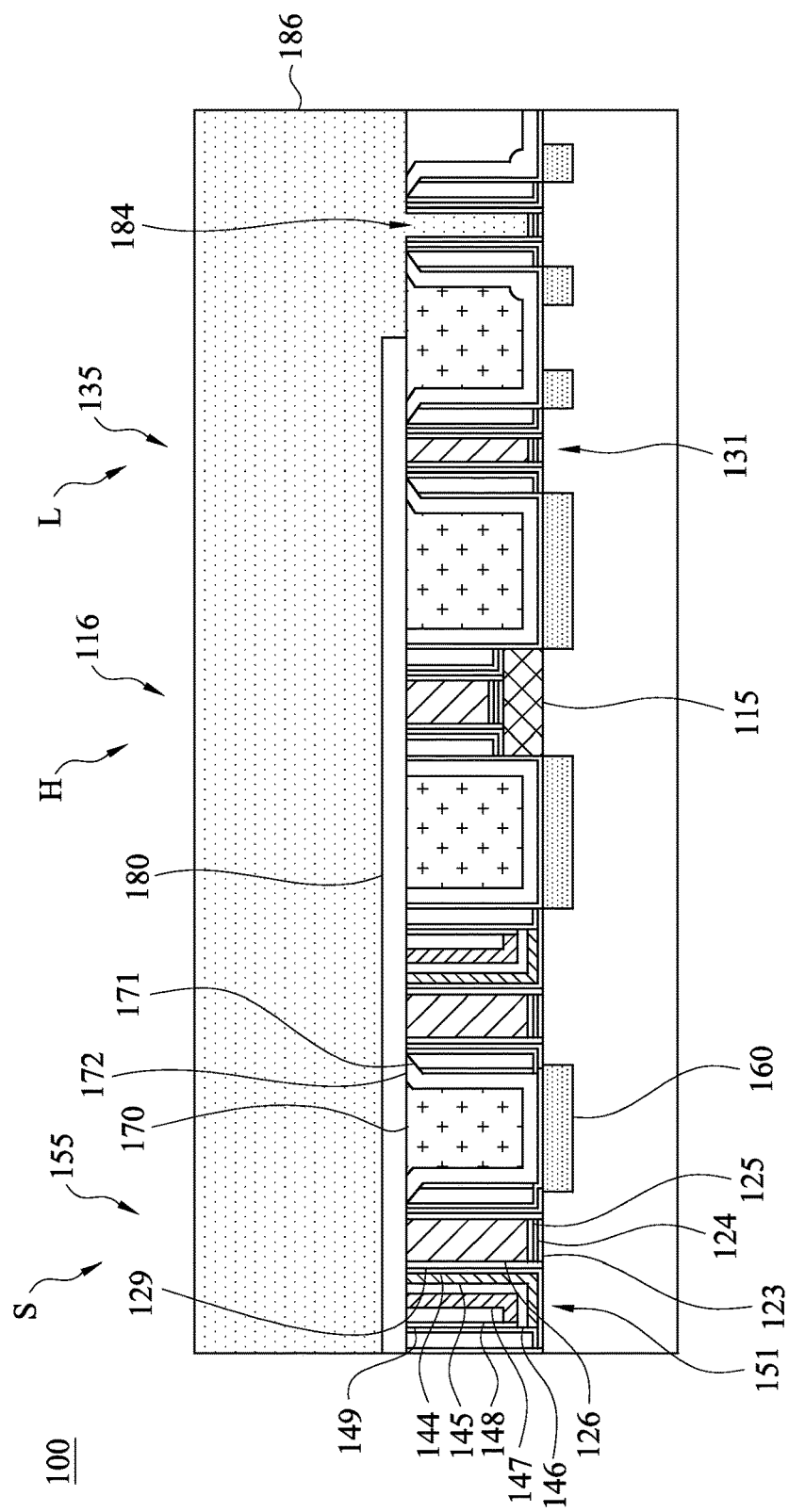
Figure 15:
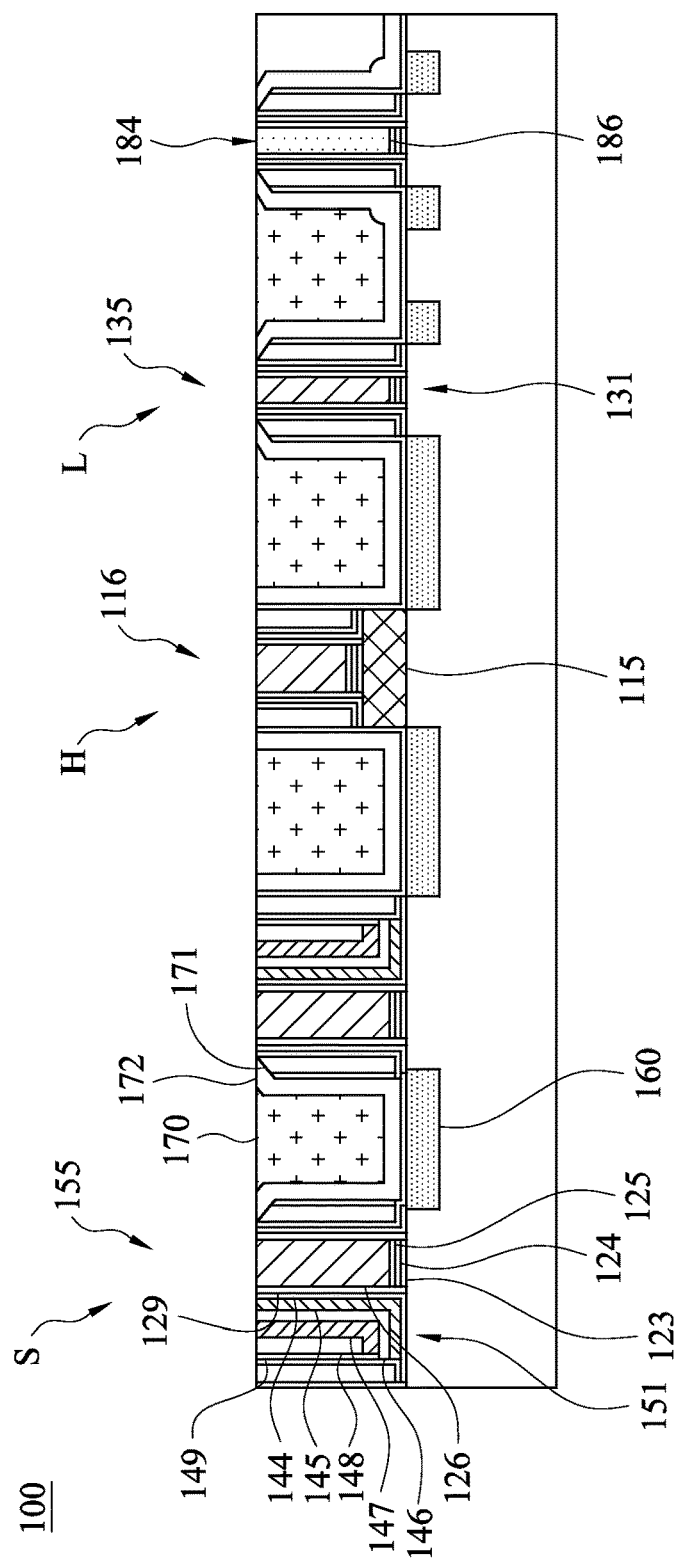

As shown in FIG. 14, a P-metal layer 186 is formed on or above the semiconductor device 100, such that the P-type logic gate opening 184 is filled with the P-metal layer 186. Then, as shown in FIG. 15, the semiconductor device 100 is planarized, and the P-metal layer 186 outside the P-type logic gate opening 184 is removed.

Figure 16:
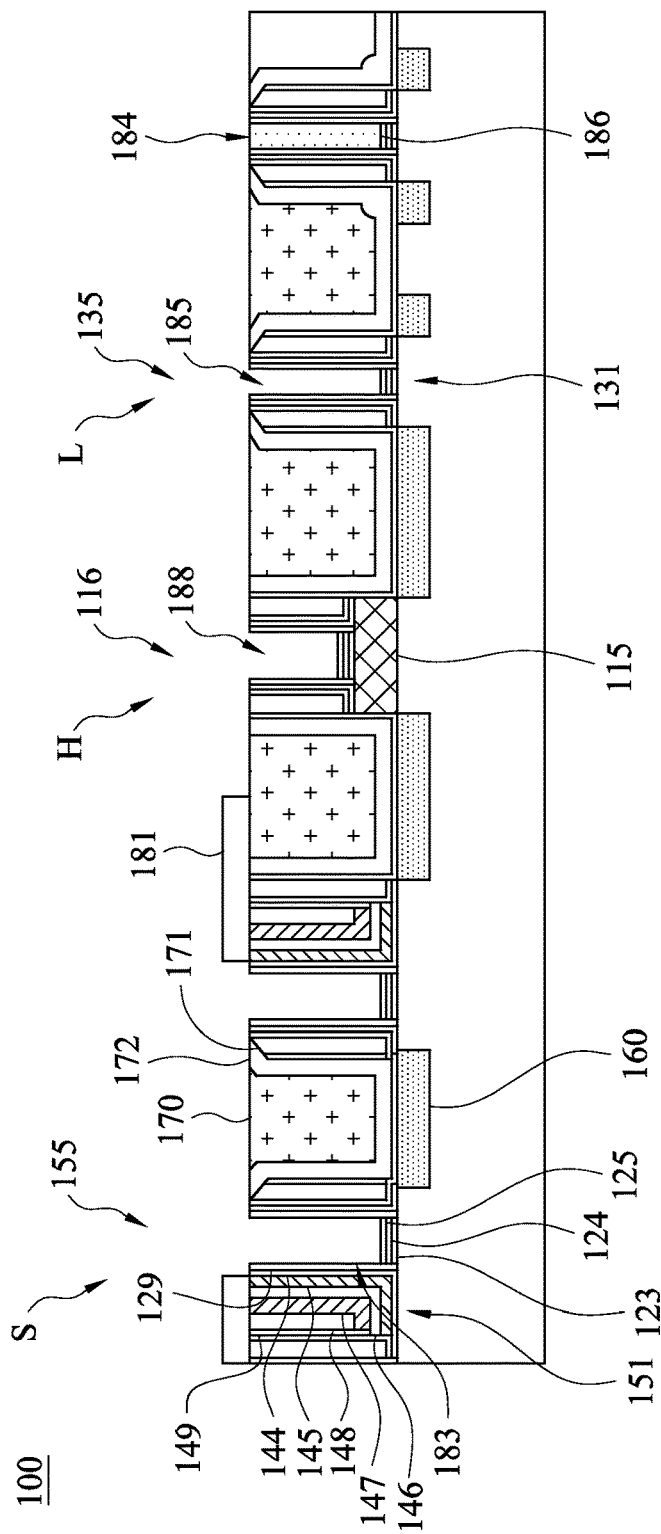

As shown in FIG. 16, a N-metal replacement mask 181 is formed on or above the semiconductor device 100 of FIG. 16. The material of the N-metal replacement mask 181 can be bottom anti-reflective coating (BARC). The dummy gate layer 126 of the other logic device 135, the dummy gate layer 126 of at least one of the split gate memory devices 155, and the dummy gate layer 126 of the high voltage device H are exposed by the N-metal replacement mask 181. The dummy gate layer 126 of the other logic device 135, the dummy gate layer 126 of at least one of the split gate memory devices 155, and the dummy gate layer 126 of the high voltage device H are removed to form at least one select gate opening 183 in the split gate memory devices 155, specifically the split gate stacks S, at least one N-type logic gate opening 185 in the logic devices 135, specifically the logic gate stacks L, and at least one high voltage device gate opening 188 in the high voltage device H, specifically the high voltage device gate stack H.

Figure 17:
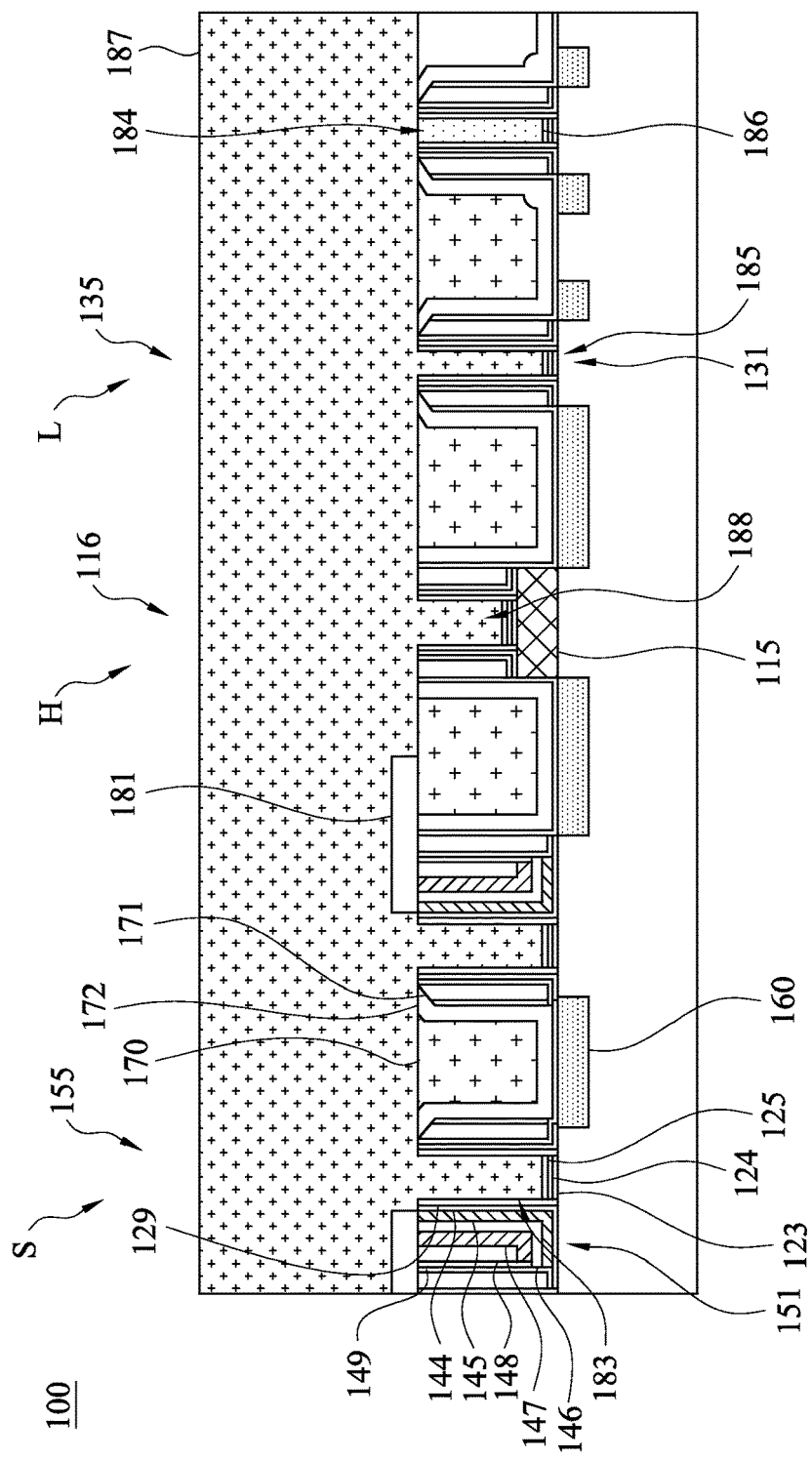
Figure 18:
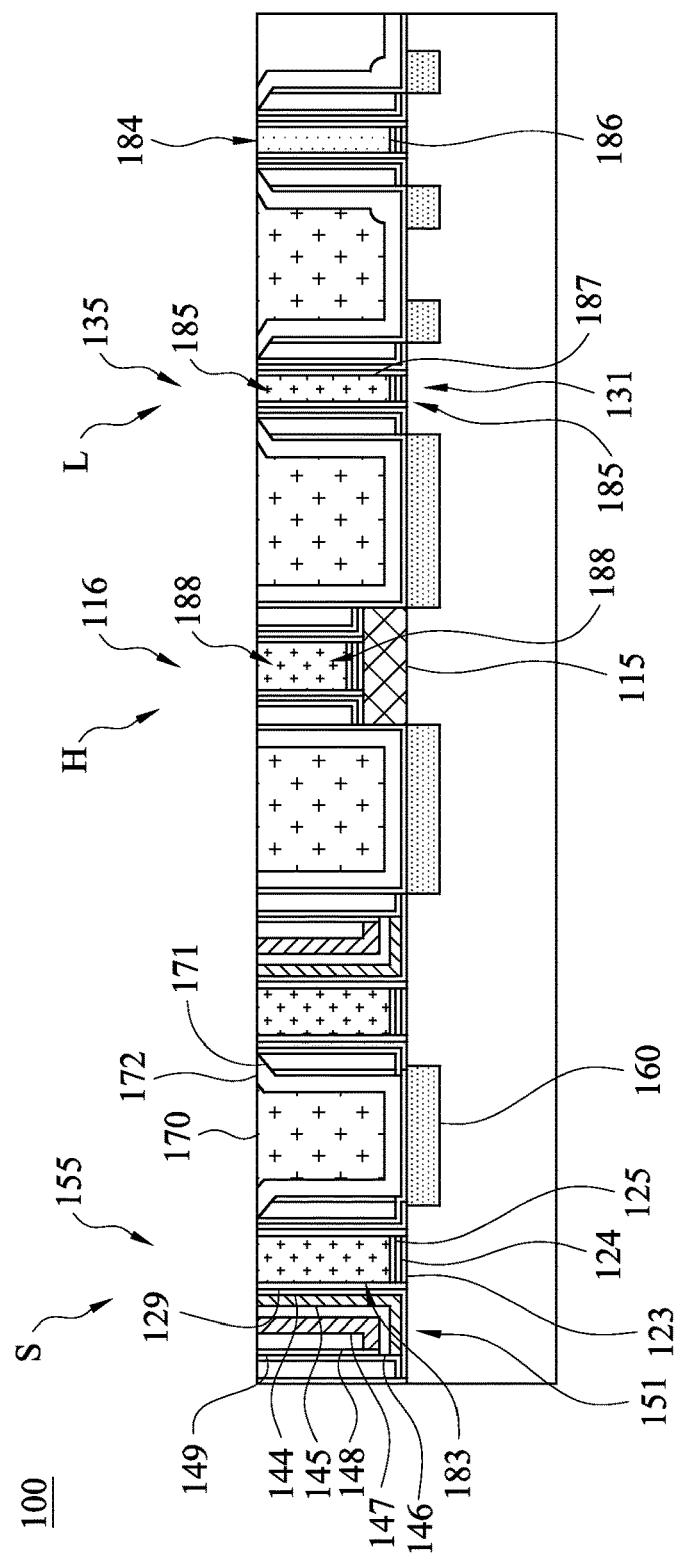

As shown in FIG. 17, N-metal layer 187 is formed on or above the semiconductor device 100, such that the select gate opening 183, the N-type logic gate opening 185, and the high voltage device gate opening 188 are filled with the N-metal layer 187. Then, as shown in FIG. 18, the semiconductor device 100 is planarized, and the N-metal layer 187 outside the select gate opening 183, the N-type logic gate opening 185, and the high voltage device gate opening 188 are removed.

Specifically, the material of the P-metal layer 186 is a metal with a band edge effective work function larger than 4.9 eV, and the material of the N-metal layer 187 is a metal with a band edge effective work function smaller than 4.1 eV.

Figure 19:
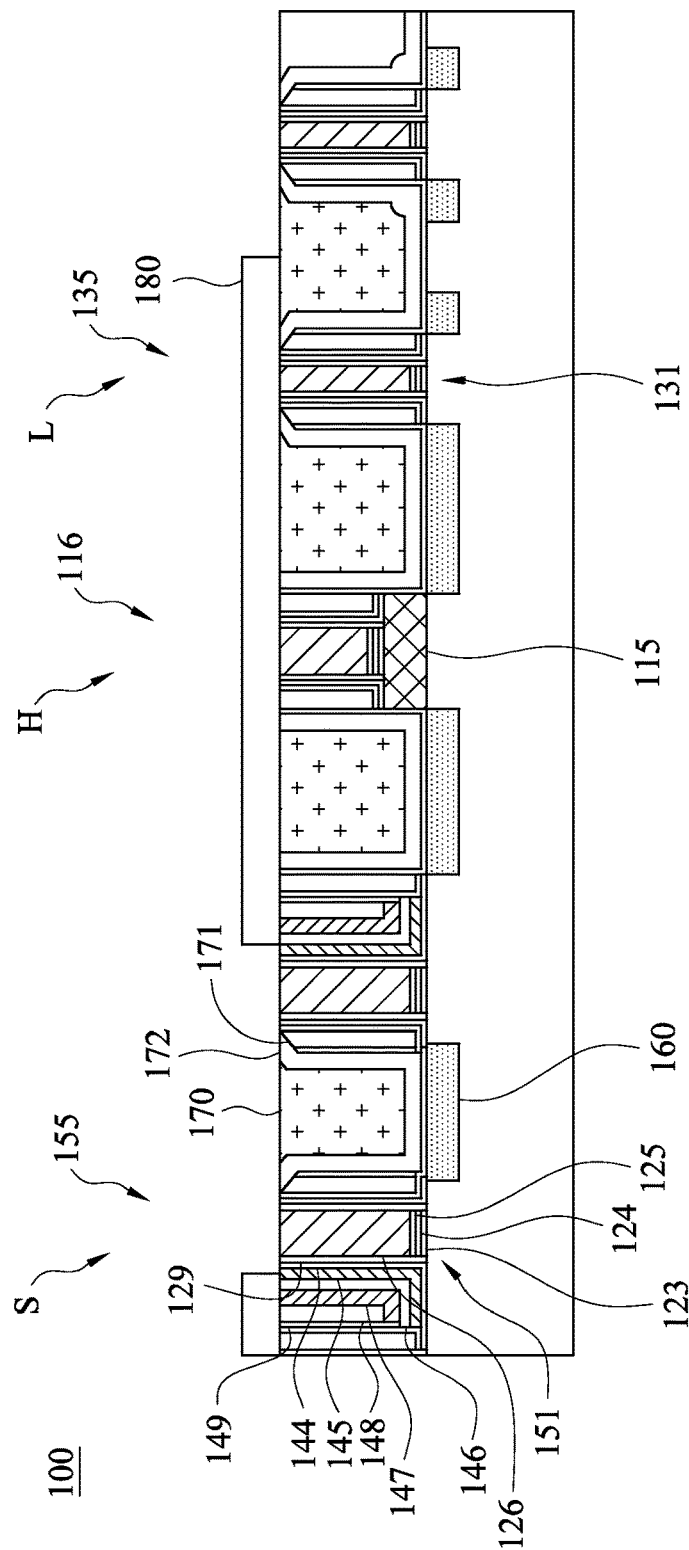
FIGS. 19 through 25 are cross-sectional views of intermediate steps in an RPG loop according to some embodiments.

FIGS. 19 through 25 illustrate cross-sectional views of intermediate steps in an RPG loop according to some embodiments. As shown in FIG. 19, a P-metal replacement mask 180 is formed on or above the semiconductor device 100 of FIG. 19. The dummy gate layer 126 of at least one of the logic devices 135 and the dummy gate layer 126 of at least one of the split gate memory devices 155 are exposed by the P-metal replacement mask 180. The material of the P-metal replacement mask 180 can be titanium nitride (TiN). The thickness of the P-metal replacement 180 can be 3 nm.

Figure 20:
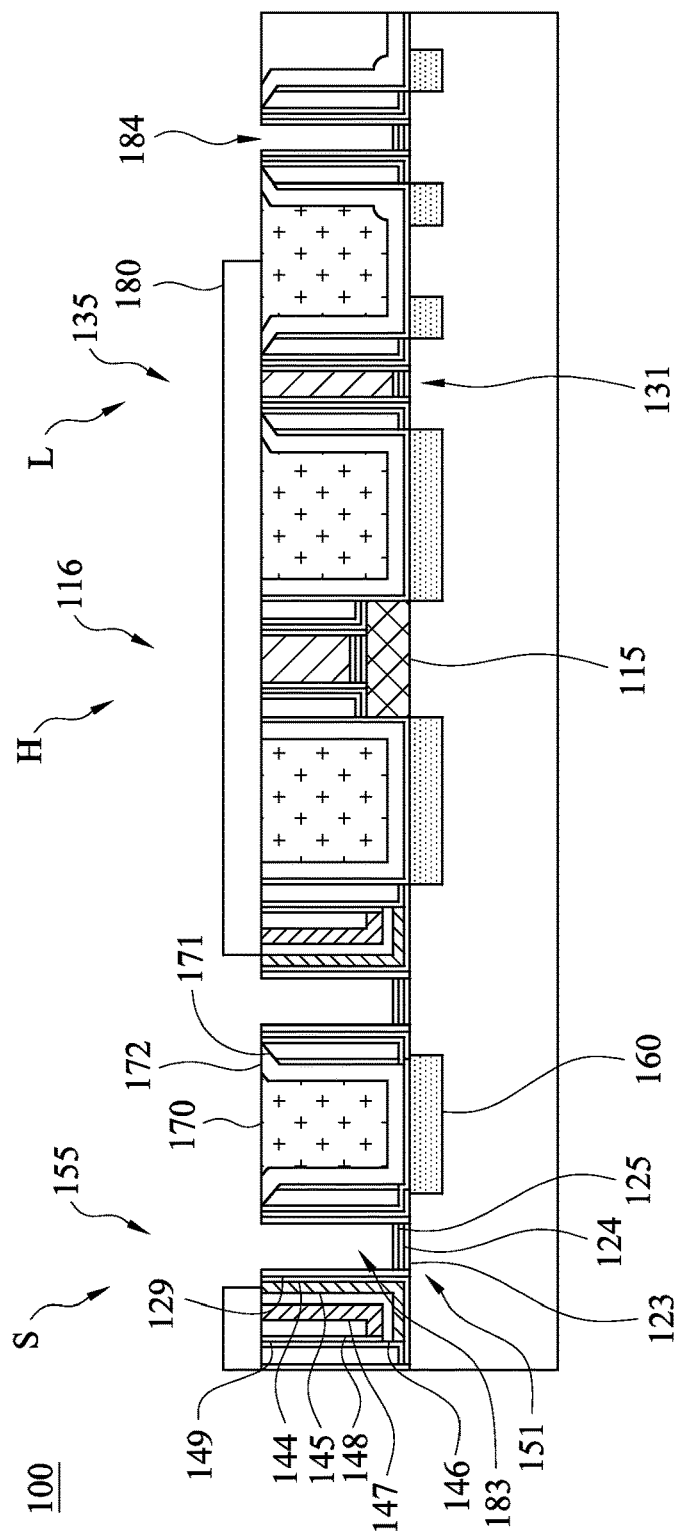

As shown in FIG. 20, the dummy gate layer 126 of at least one of the logic devices 135 and the dummy gate layer 126 of at least one of the split gate memory devices 155 are removed to form at least one select gate opening 183 in the split gate memory devices 155, specifically the split gate stacks S, and at least one P-type logic gate opening 184 in the logic devices 135, specifically the logic gate stacks L.

Figure 21:
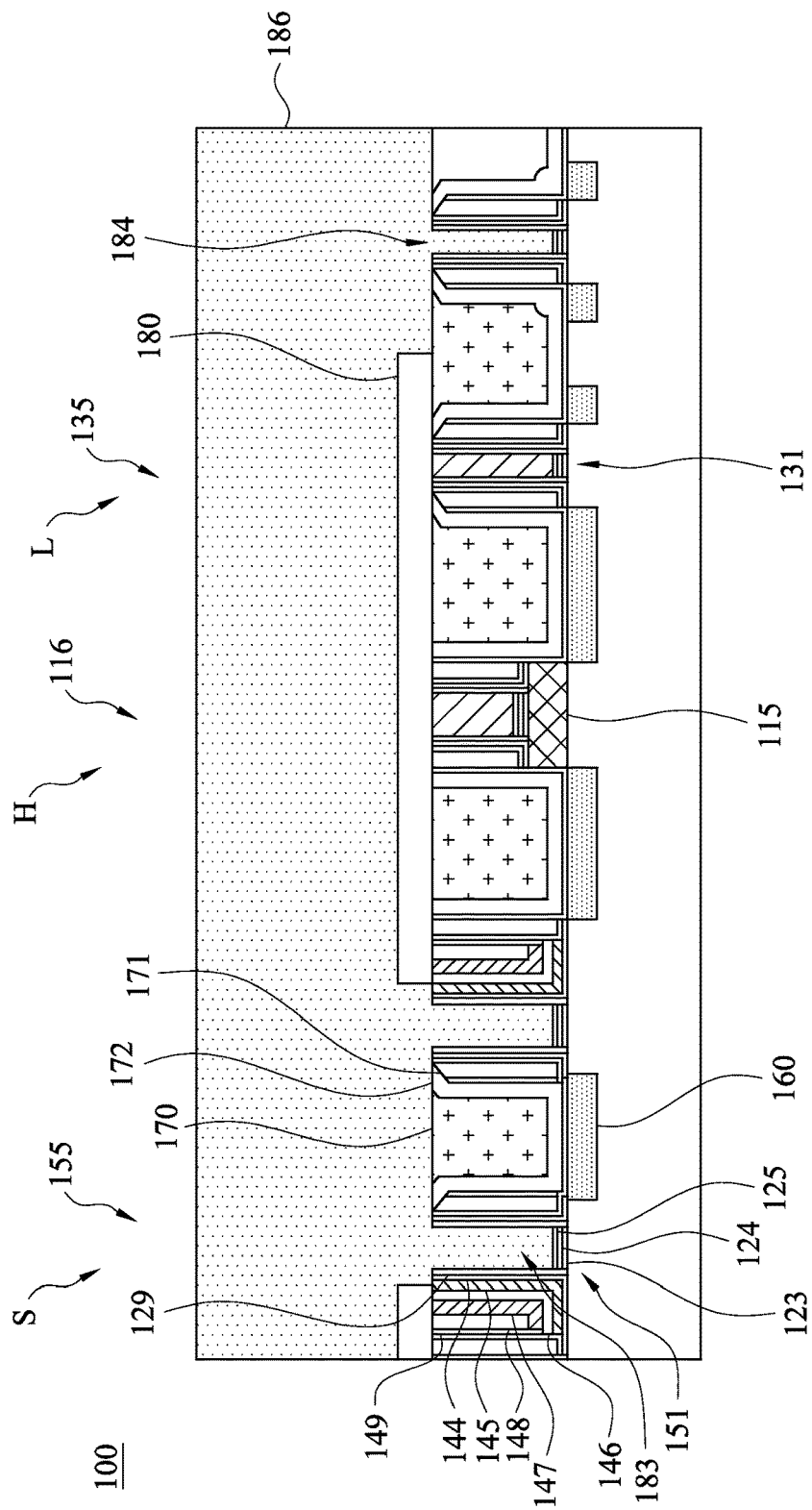
Figure 22:
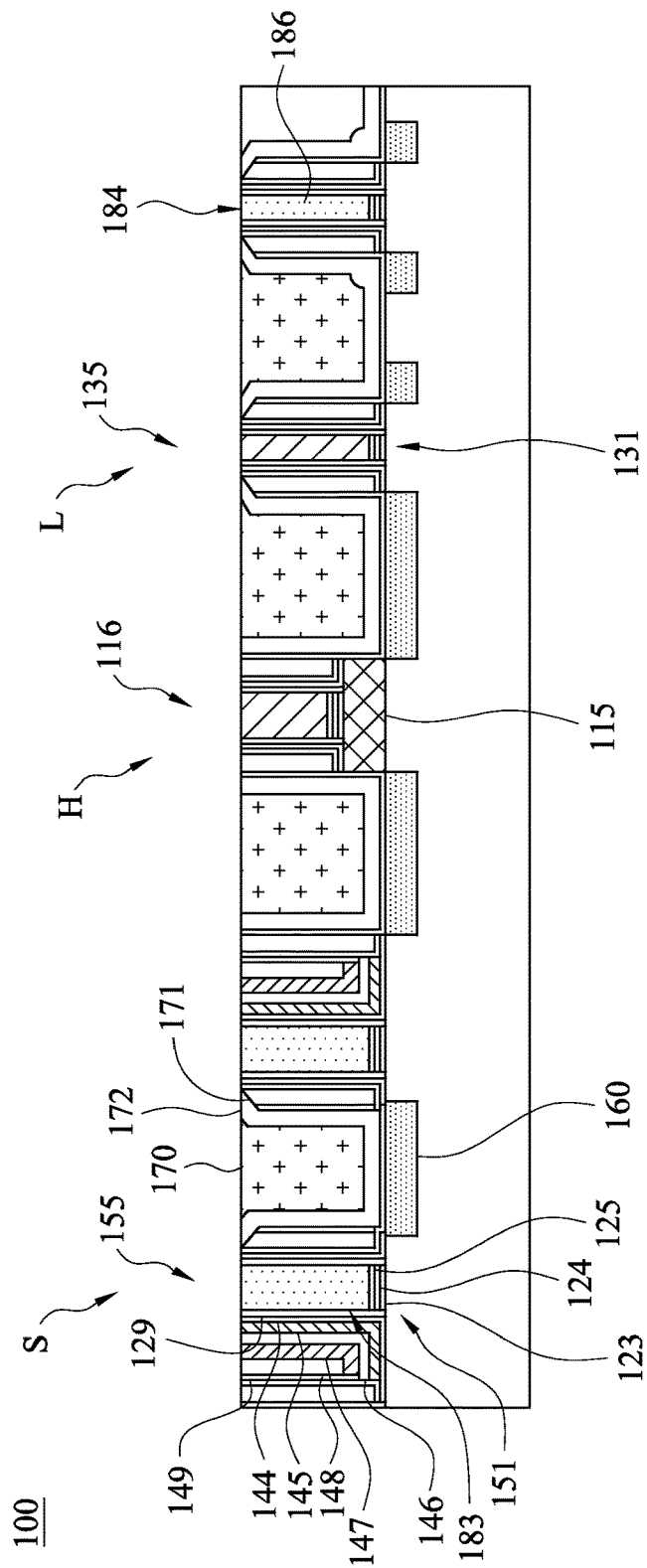

As shown in FIG. 21, a P-metal layer 186 is formed on or above the semiconductor device 100, such that the select gate opening 183 and the P-type logic gate opening 184 are filled with the P-metal layer 186. Then, as shown in FIG. 22 the semiconductor device 100 is planarized, and the P-metal layer 186 outside the select gate opening 183 and the P-type logic gate opening 184 are removed.

Figure 23:
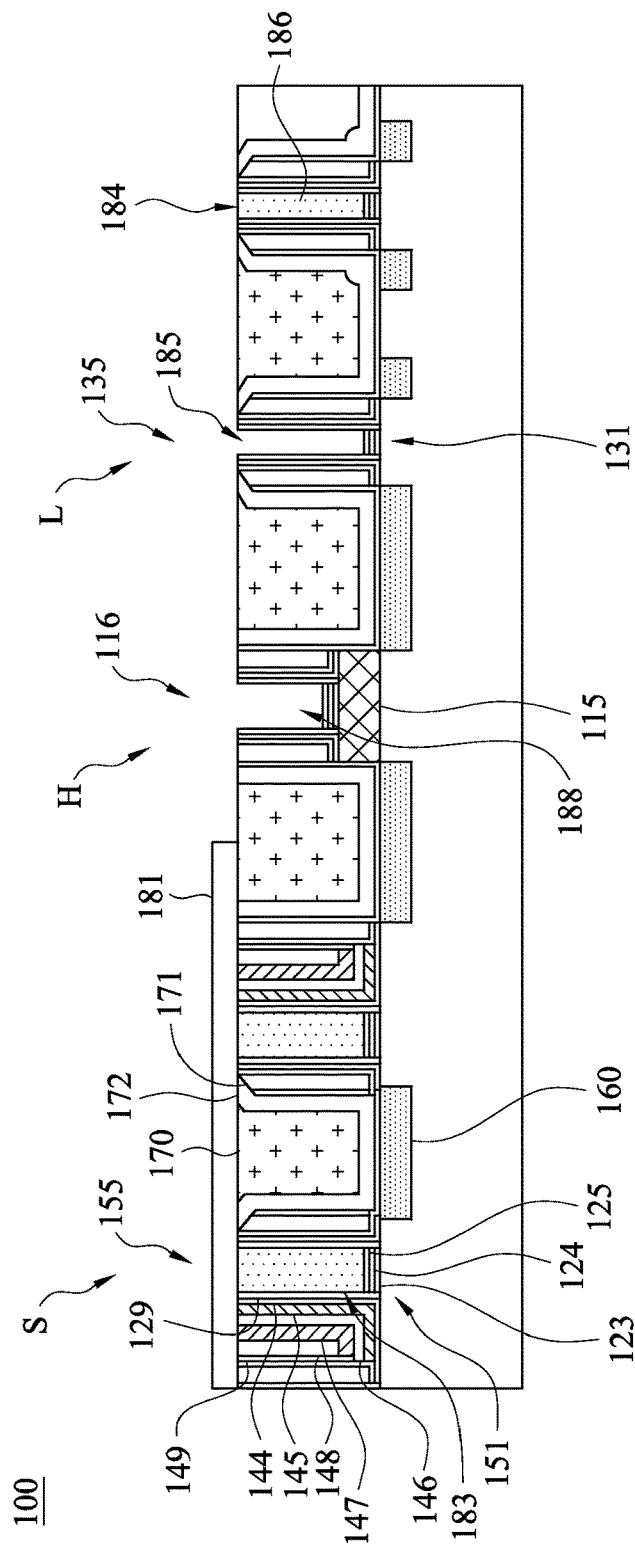

As shown in FIG. 23, a N-metal replacement mask 181 is formed on or above the semiconductor device 100 of FIG. 23. The dummy gate layer 126 of the other logic devices 135 and the dummy gate layer 126 of the high voltage device 116 are exposed by the N-metal replacement mask 181. The dummy gate layer 126 of the other logic devices 135 and the dummy gate layer 126 of the high voltage device 116 are removed to form at least one N-type logic gate opening 185 in the logic devices 135, specifically the logic gate stacks L, and at least one high voltage device gate opening 188 in the high voltage device 116, specifically the high voltage device gate stack H.

Figure 24:
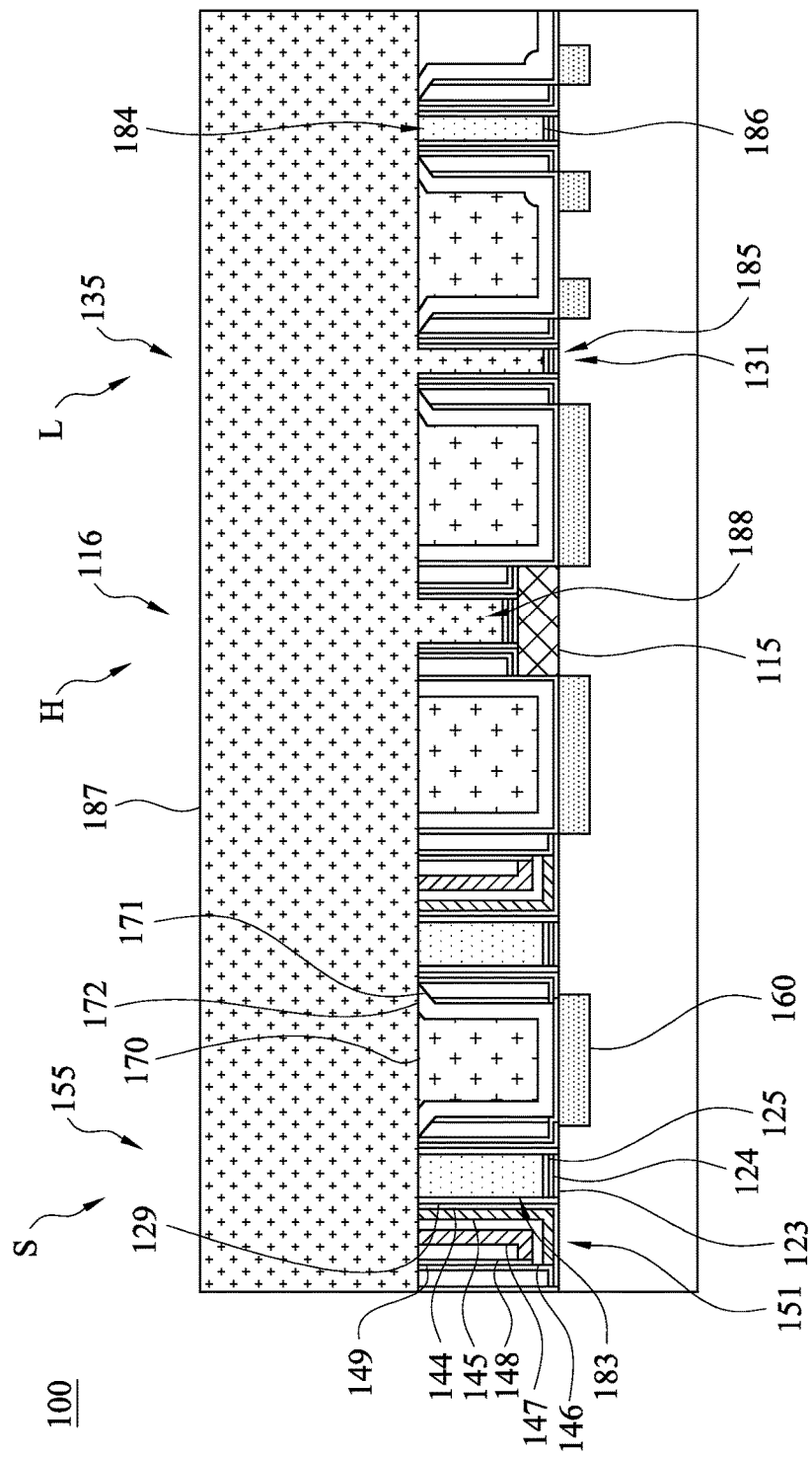
Figure 25:
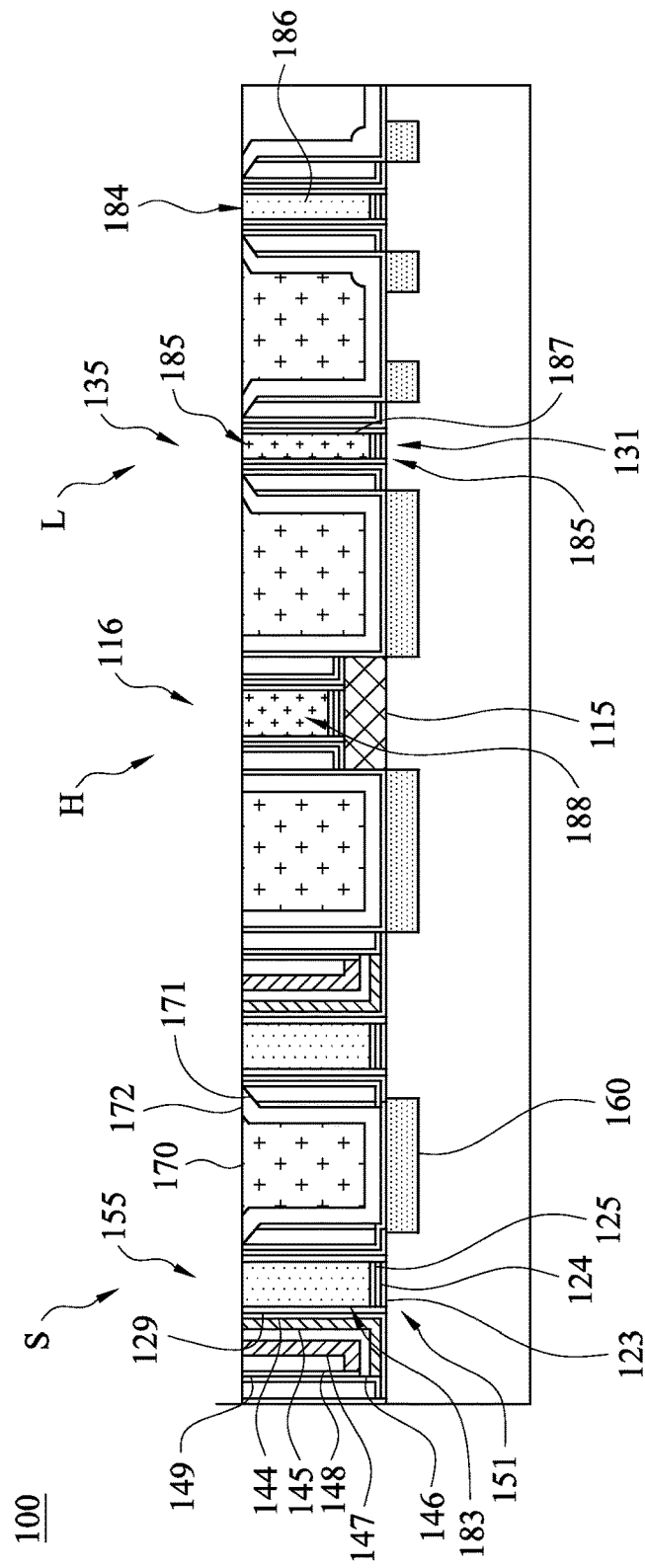

As shown in FIG. 24, N-metal layer 187 is formed on or above the semiconductor device 100, such that the N-type logic gate opening 185, and the high voltage device gate opening 188 are filled with the N-metal layer 187. Then, as shown in FIG. 25, the semiconductor device 100 is planarized, and the N-metal layer 187 outside the N-type logic gate opening 185, and the high voltage device gate opening 188 are removed.

Figure 26:
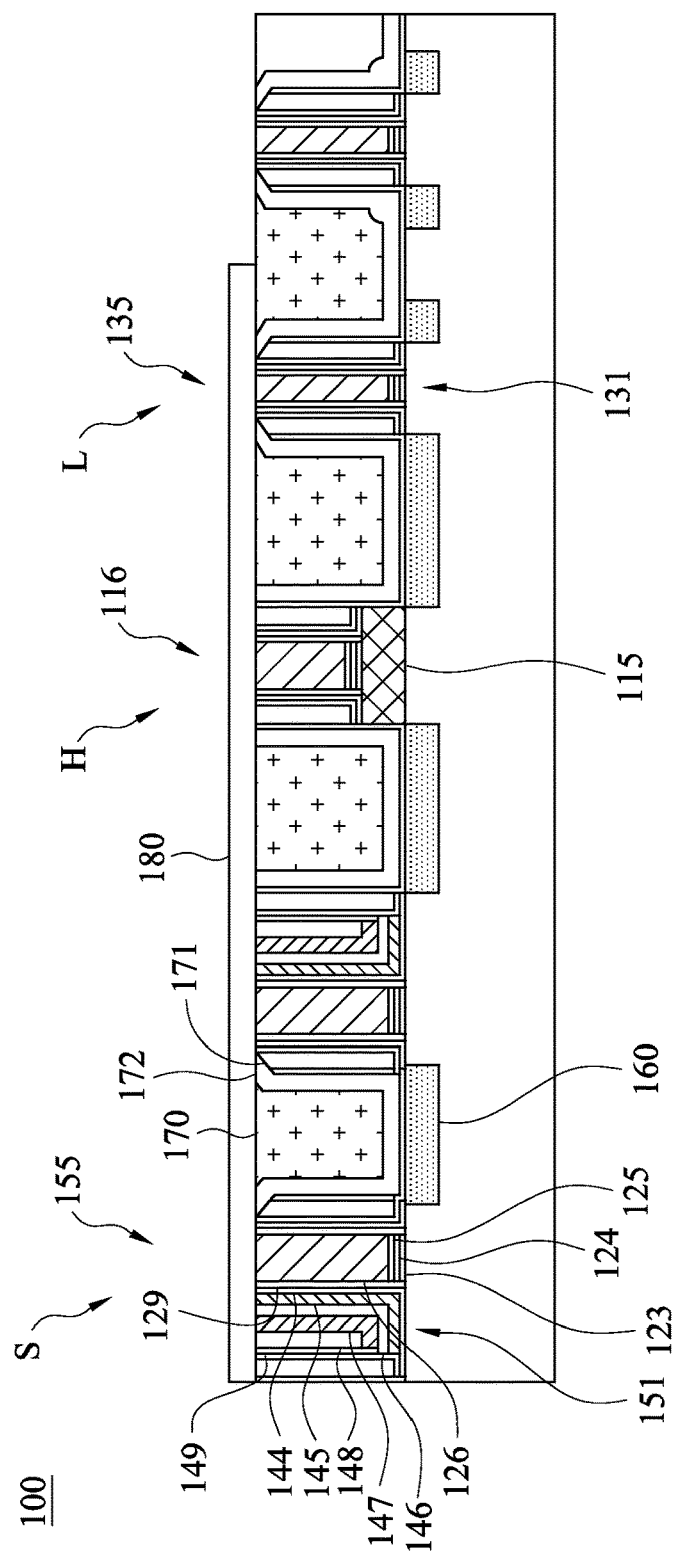
FIGS. 26 through 32 are cross-sectional views of intermediate steps in an RPG loop according to some embodiments.

FIGS. 26 through 32 illustrate cross-sectional views of intermediate steps in an RPG loop according to some embodiments. As shown in FIG. 26, a P-metal replacement mask 180 is formed on or above the semiconductor device 100 of FIG. 26. The dummy gate layer 126 of at least one of the logic devices 135 is exposed by the P-metal replacement mask 180. The material of the P-metal replacement mask 180 can be titanium nitride (TiN). The thickness of the P-metal replacement 180 can be 3 nm.

Figure 27:
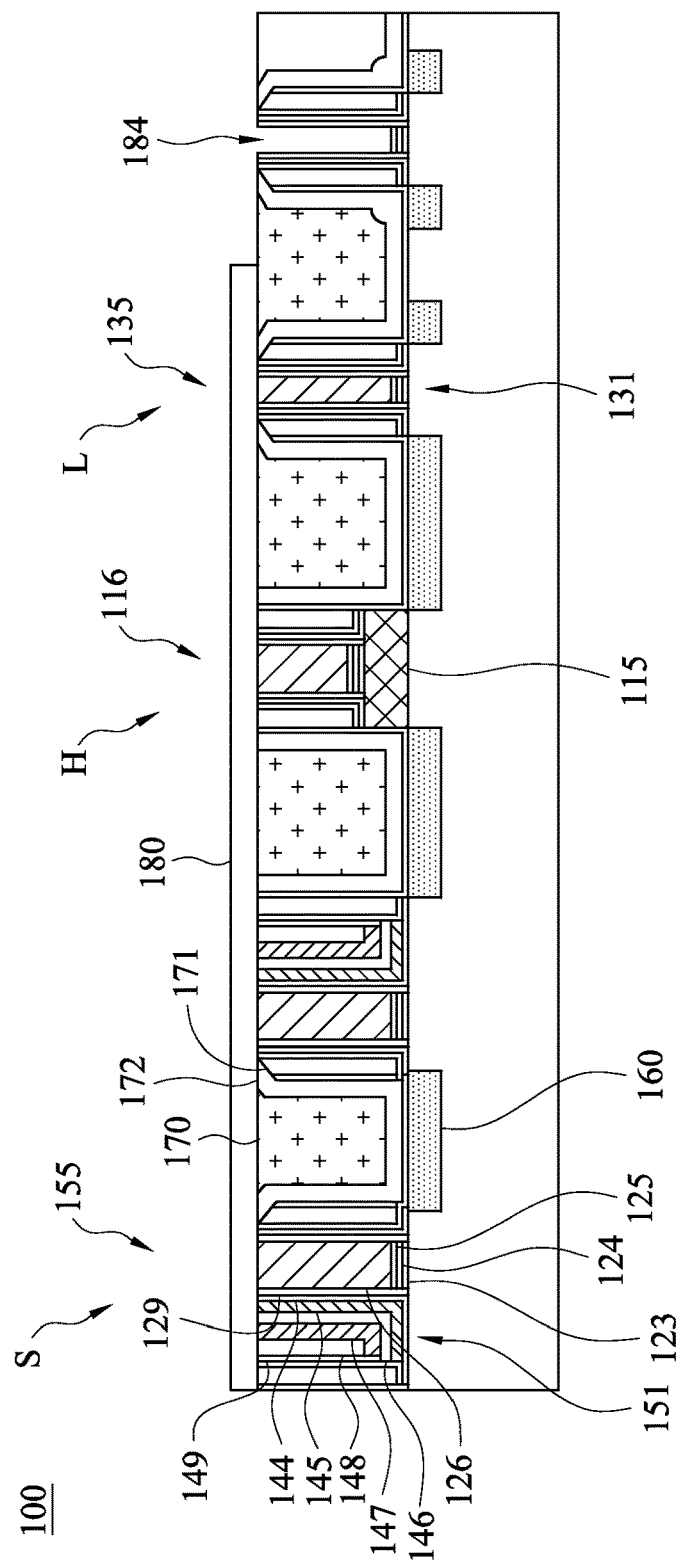

As shown in FIG. 27, the dummy gate layer 126 of at least one of the logic devices 135 is removed to form at least one P-type logic gate opening 184 in the logic devices 135, specifically the logic gate stacks L.

Figure 28:
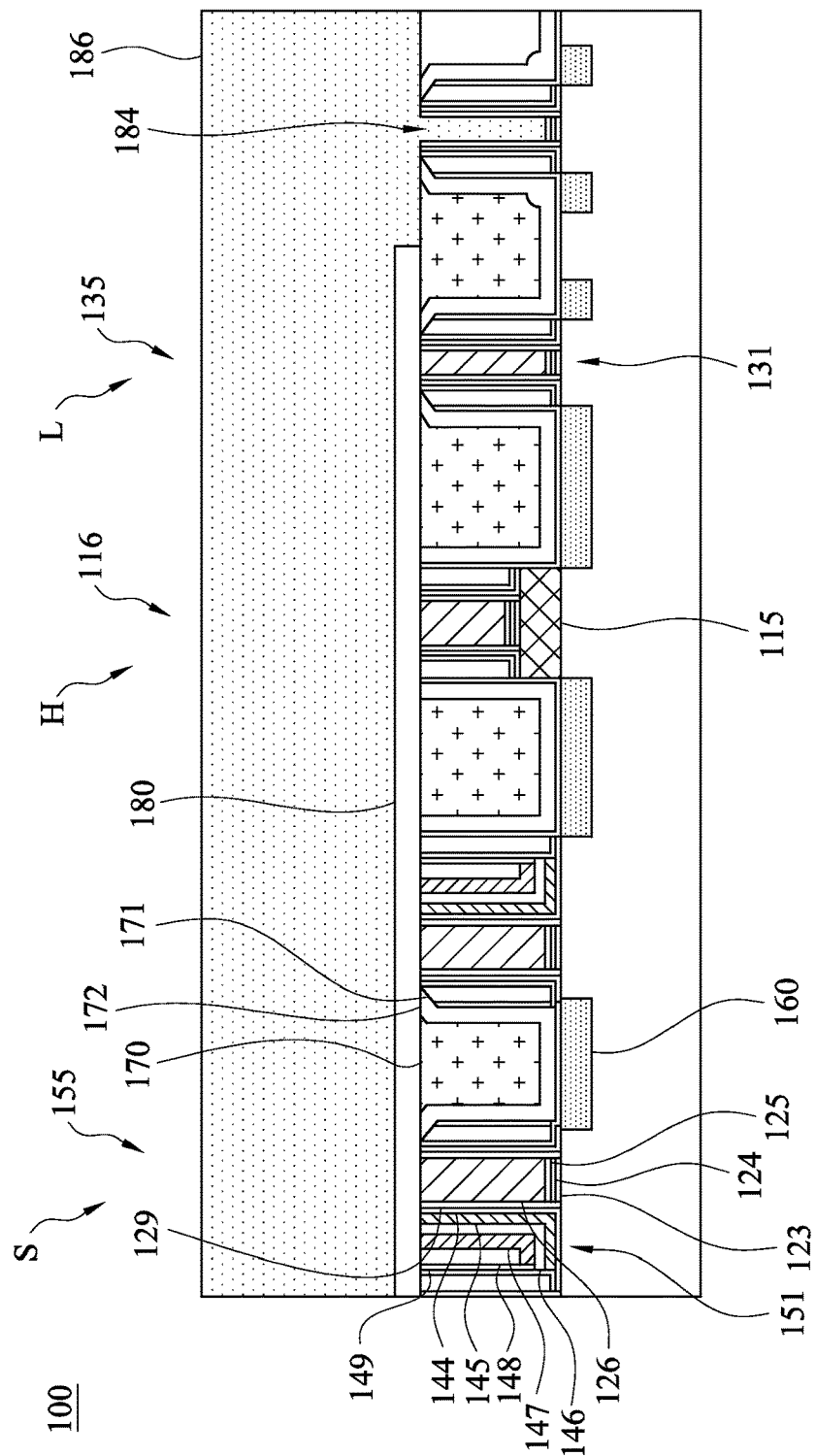
Figure 29:
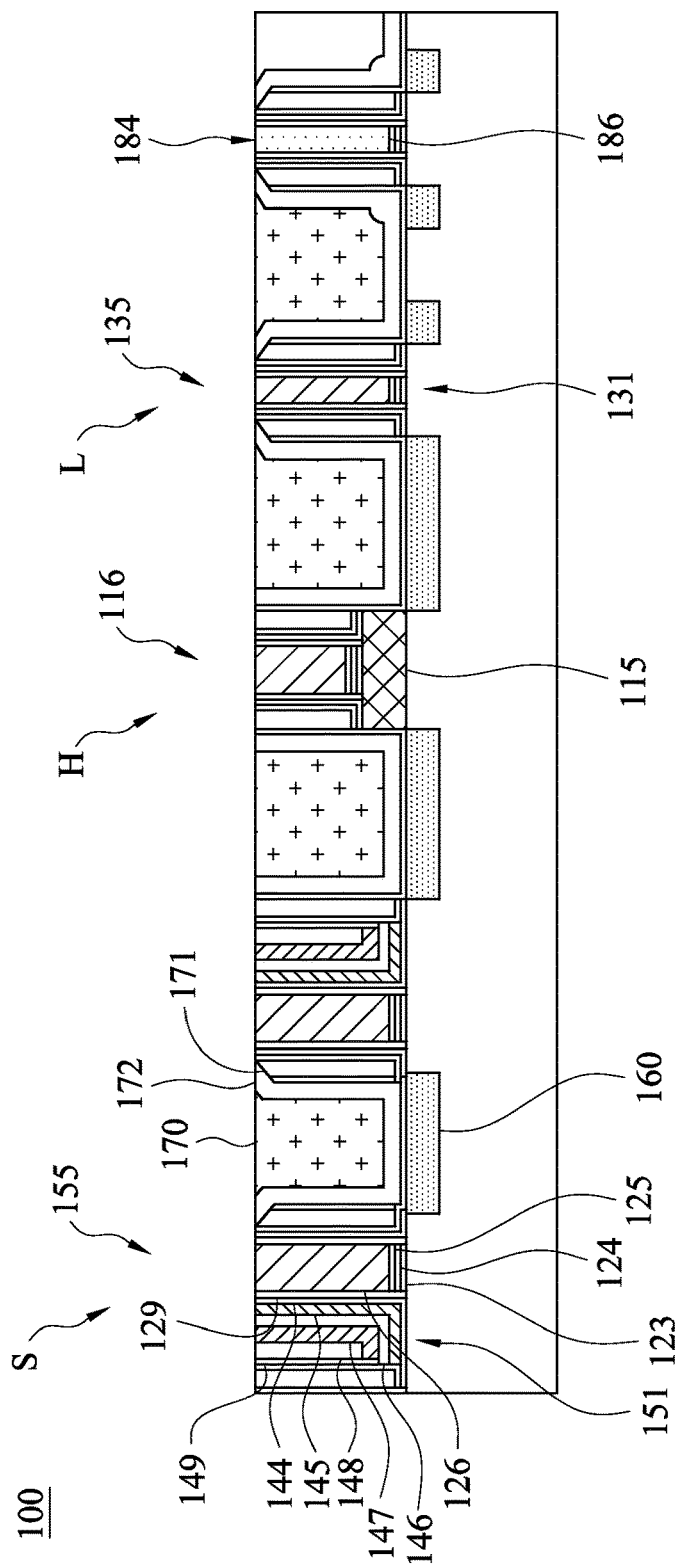

As shown in FIG. 28, a P-metal layer 186 is formed on or above the semiconductor device 100, such that the P-type logic gate opening 184 is filled with the P-metal layer 186. Then, as shown in FIG. 29, the semiconductor device 100 is planarized, and the P-metal layer 186 outside the P-type logic gate opening 184 are removed.

Figure 30:
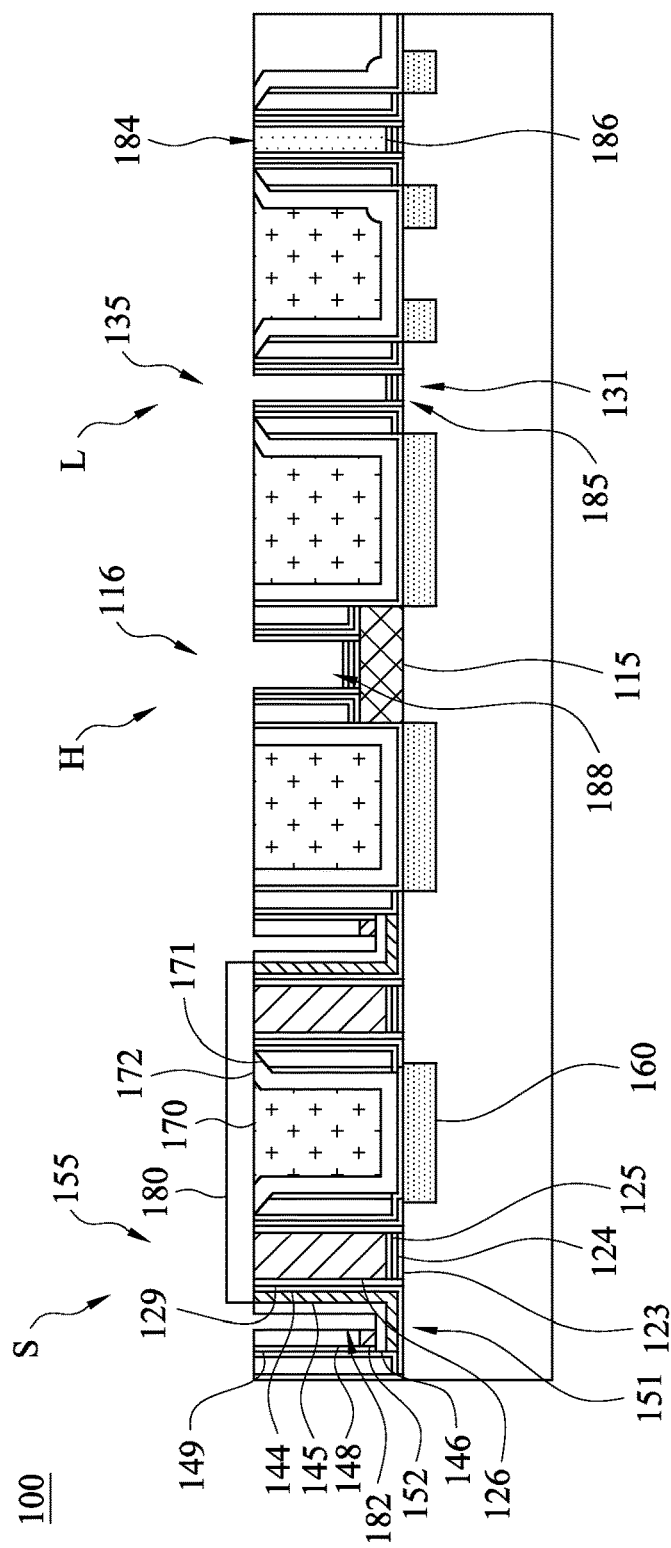

As shown in FIG. 30, a N-metal replacement mask 181 is formed on or above the semiconductor device 100 of FIG. 30. The dummy gate layer 126 of the other logic device 135, the main gate layers 147 of the split gate memory devices 155, and the dummy gate layer 126 of the high voltage device H are exposed by the P-metal replacement mask 180. The dummy gate layer 126 of the other logic device 135, the main gate layers 147 of the split gate memory devices 155, and the dummy gate layer 126 of the high voltage device H are removed to form at least one main gate opening 182 in the split gate memory devices 155, specifically the split gate stacks S, at least one P-type logic gate opening 184 in the logic devices 135, specifically the logic gate stacks L, and at least one high voltage device gate opening 188 in the high voltage device H, specifically the high voltage device gate stack H.

Furthermore, since the part of the main gate layer 147 of the split gate memory devices 155 are removed by etching, a part of the main gate layer 147 remains between the second hard mask layer 148 and the blocking layer 146. In addition, the part of the main gate layer 147 remaining between the second hard mask layer 148 and the blocking layer 146 may be considered a silicon residue 152 when the main gate layer 147 is made of silicon.

Figure 31:
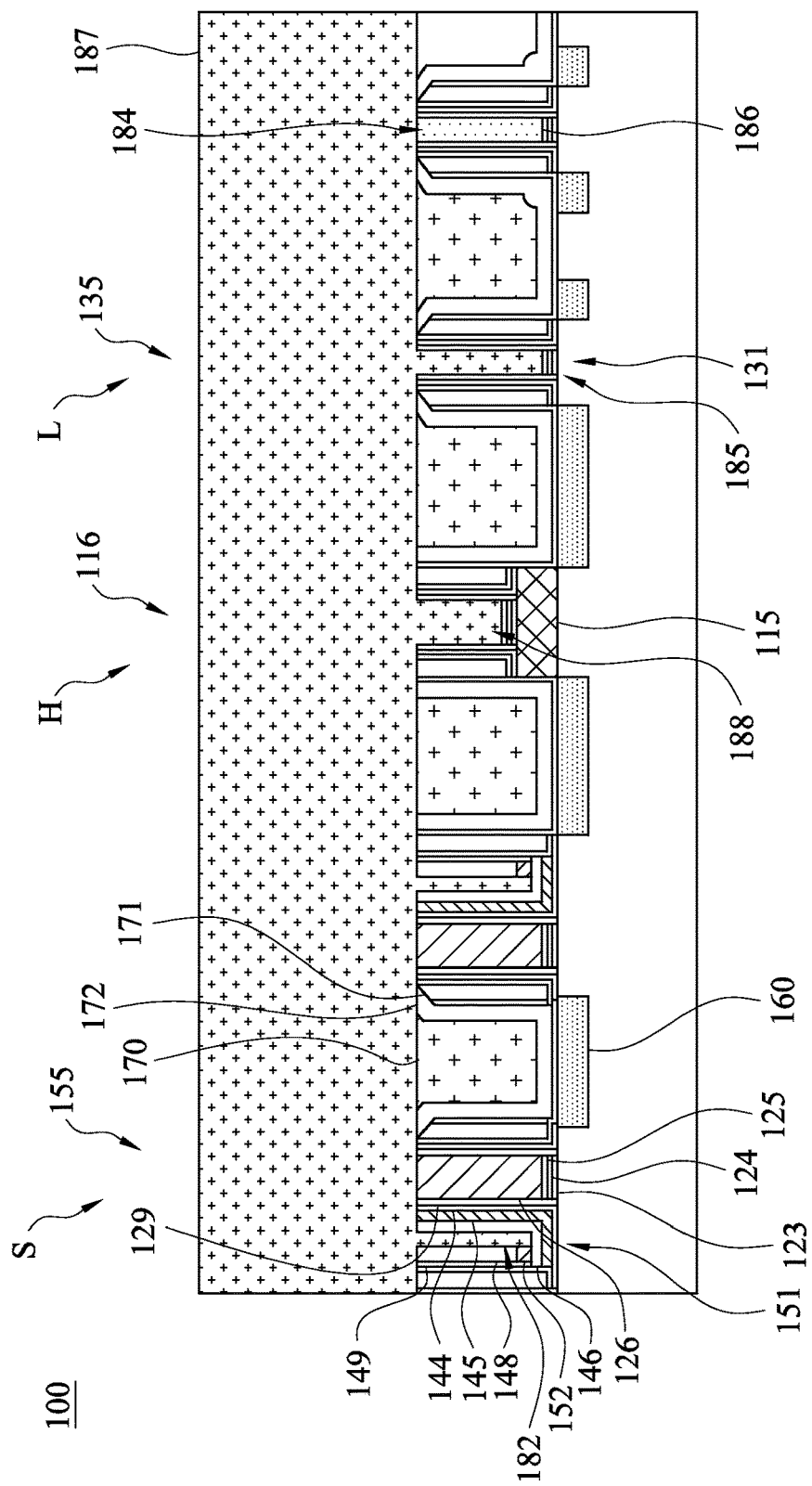
Figure 32:
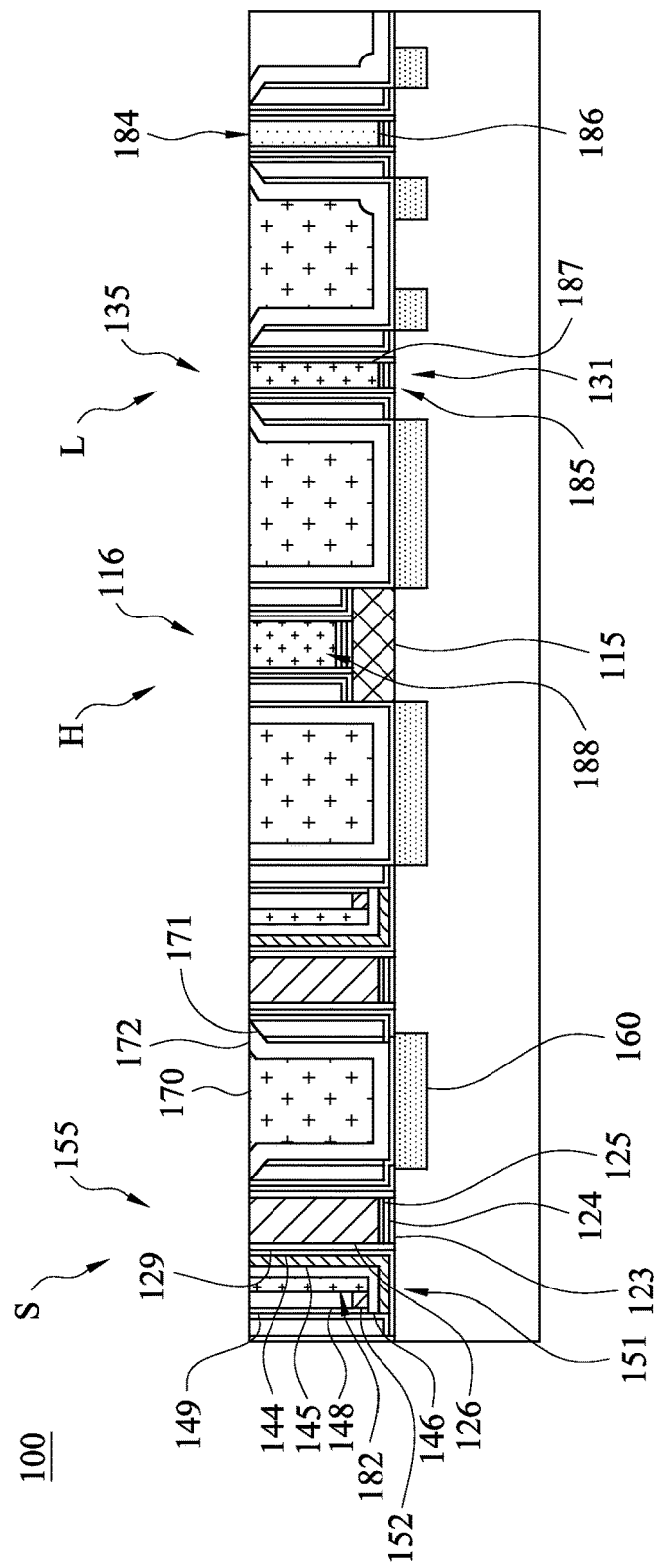

As shown in FIG. 31, N-metal layer 187 is formed on or above the semiconductor device 100, such that the main gate opening 182, the N-type logic gate opening 185, and the high voltage device gate opening 188 are filled with the N-metal layer 187. Then, as shown in FIG. 32, the semiconductor device 100 is planarized, and the N-metal layer 187 outside the main gate opening 182, the N-type logic gate opening 185, and the high voltage device gate opening 188 are removed.

Figure 33:
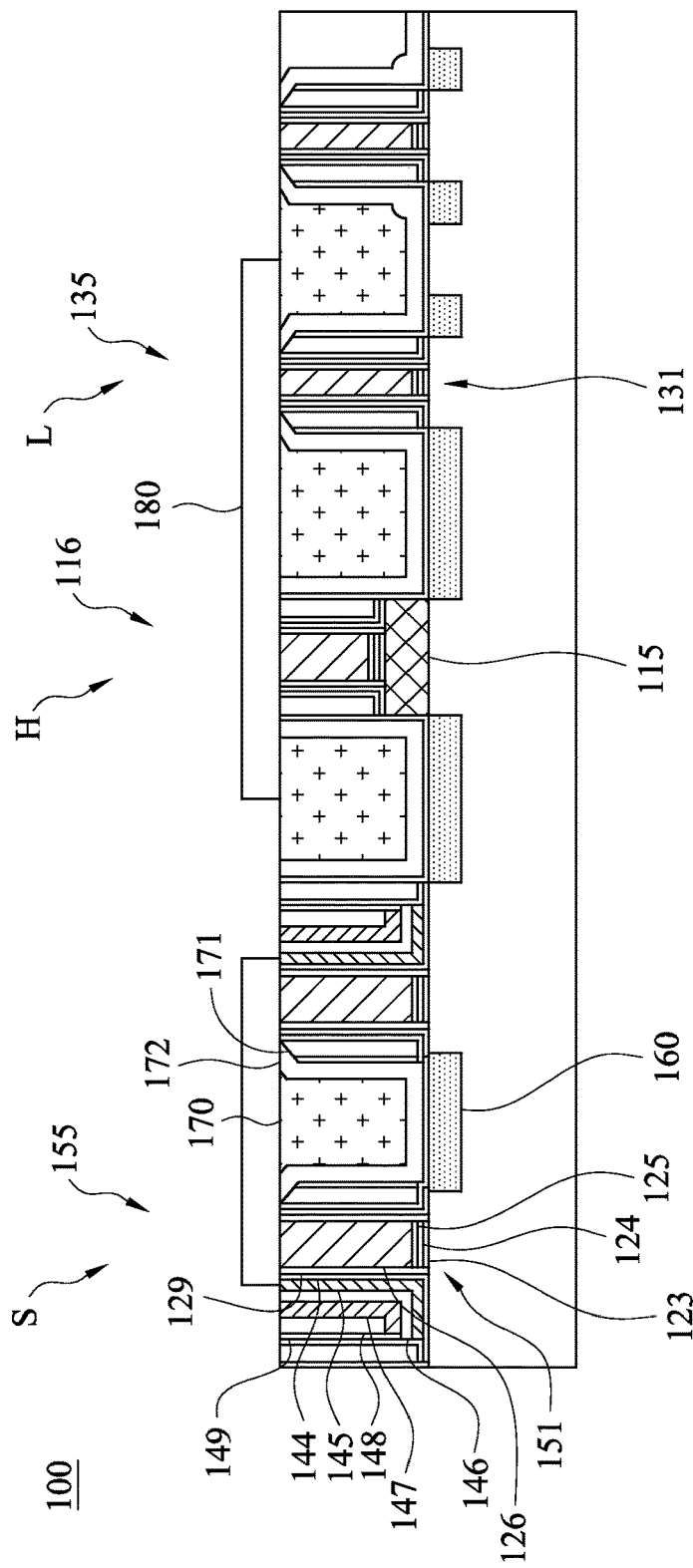
FIGS. 33 through 39 are cross-sectional views of intermediate steps in an RPG loop according to some embodiments.

FIGS. 33 through 39 illustrate cross-sectional views of intermediate steps in an RPG loop according to some embodiments. As shown in FIG. 33, a P-metal replacement mask 180 is formed on or above the semiconductor device 100 of FIG. 19. The dummy gate layer 126 of at least one of the logic devices 135 and the main gate layer 147 of at least one of the split gate memory devices 155 are exposed by the P-metal replacement mask 180. The material of the P-metal replacement mask 180 can be titanium nitride (TiN). The thickness of the P-metal replacement 180 can be 3 nm.

Figure 34:
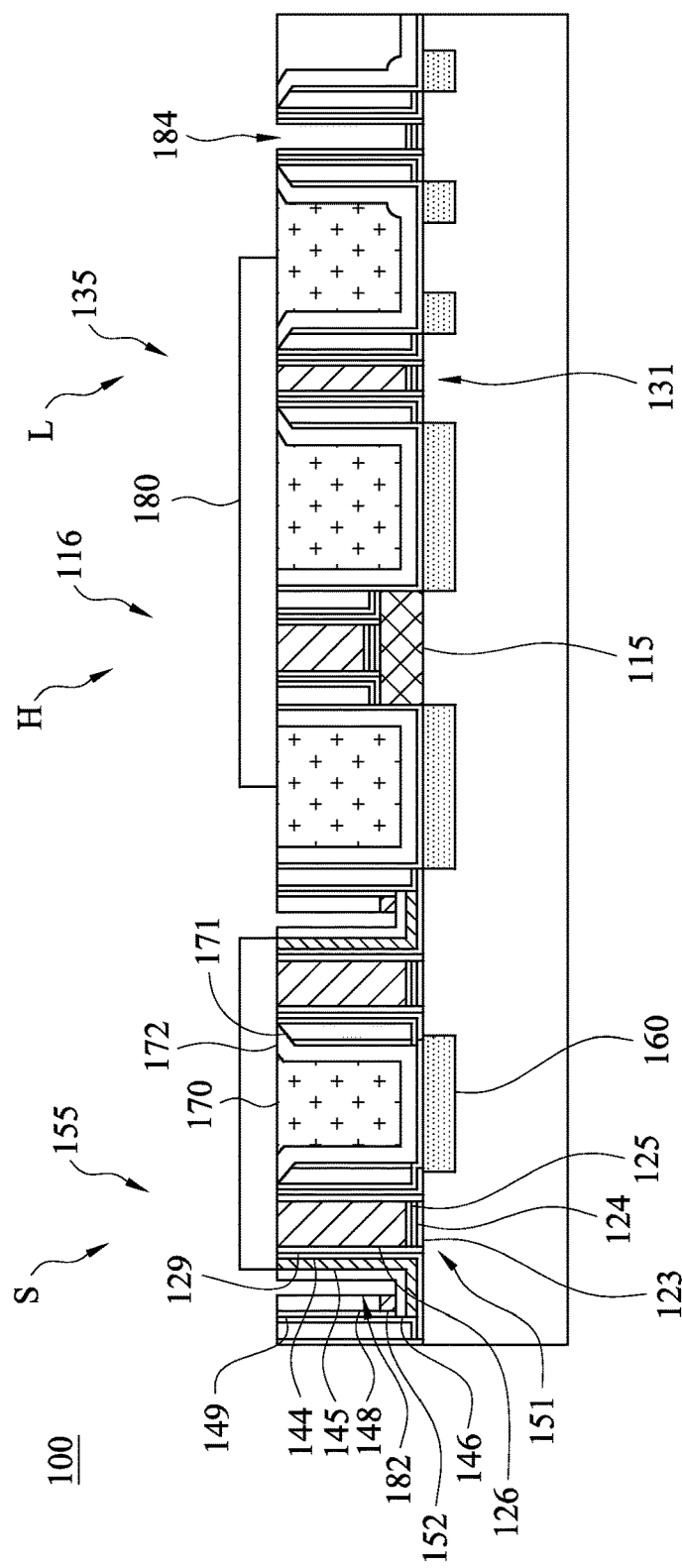

As shown in FIG. 34, the dummy gate layer 126 of at least one of the logic devices 135 and a part of the main gate layer 147 of at least one of the split gate memory devices 155 are removed to form at least one main gate opening 182 in the split gate memory devices 155, specifically the split gate stacks S, and at least one P-type logic gate opening 184 in the logic devices 135, specifically the logic gate stacks L. Furthermore, since the part of the main gate layer 147 of the split gate memory devices 155 are removed by etching, a part of the main gate layer 147 remains between the second hard mask layer 148 and the blocking layer 146. In addition, the part of the main gate layer 147 remaining between the second hard mask layer 148 and the blocking layer 146 may be considered a silicon residue 152 when the main gate layer 147 is made of silicon.

Figure 35:
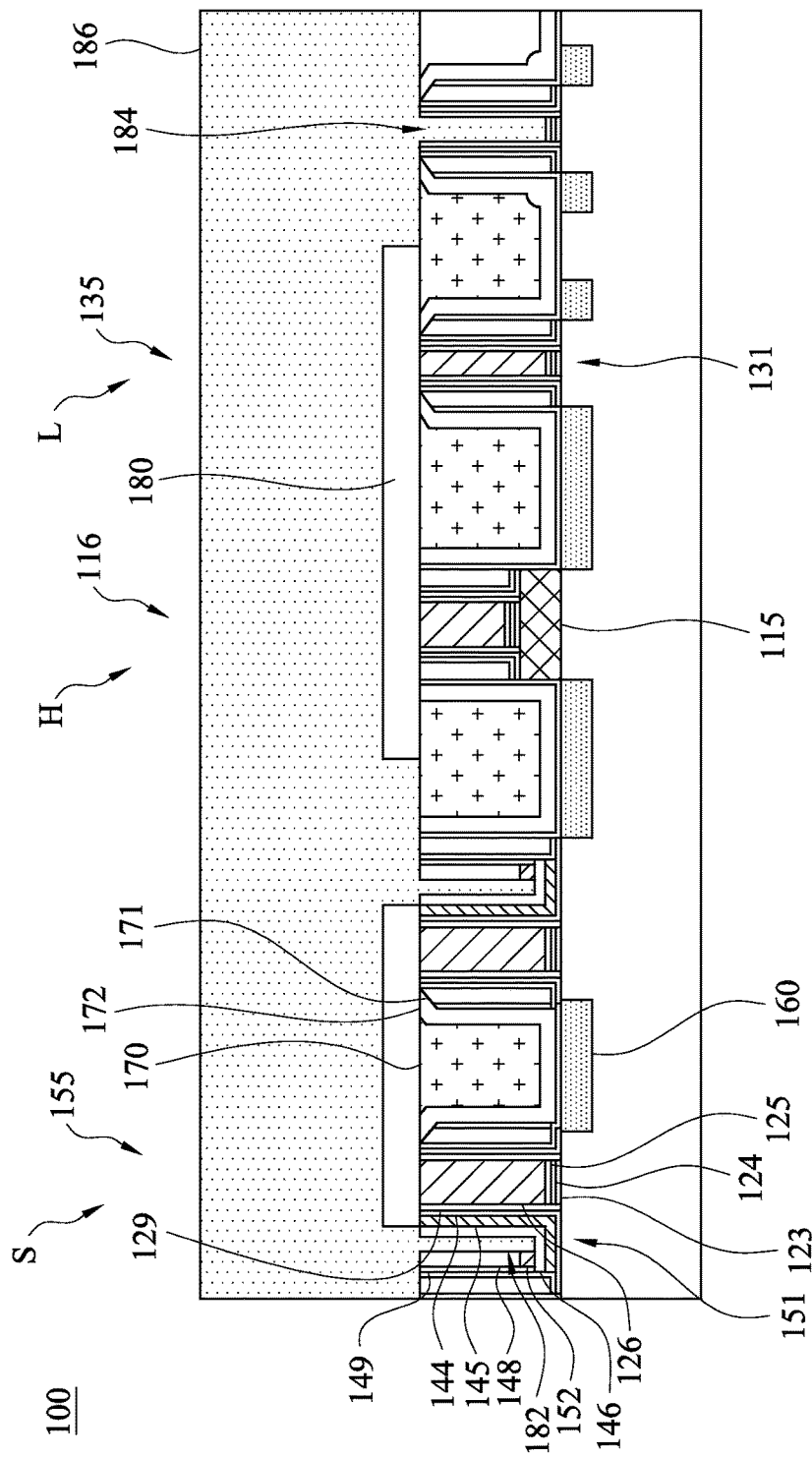
Figure 36:
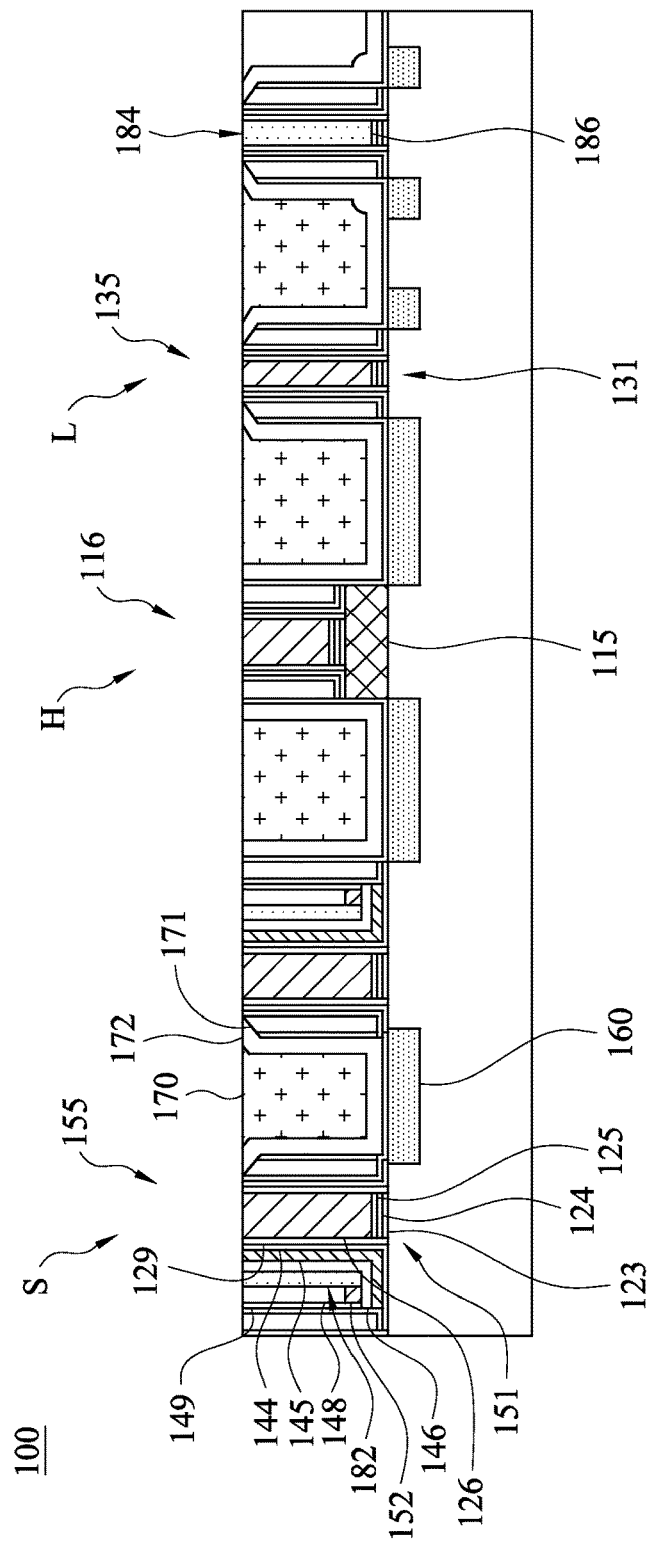

As shown in FIG. 35, a P-metal layer 186 is formed on or above the semiconductor device 100, such that the main gate opening 182 and the P-type logic gate opening 184 are filled with the P-metal layer 186. Then, as shown in FIG. 36, the semiconductor device 100 is planarized, and the P-metal layer 186 outside the main gate opening 182 and the P-type logic gate opening 184 are removed.

Figure 37:
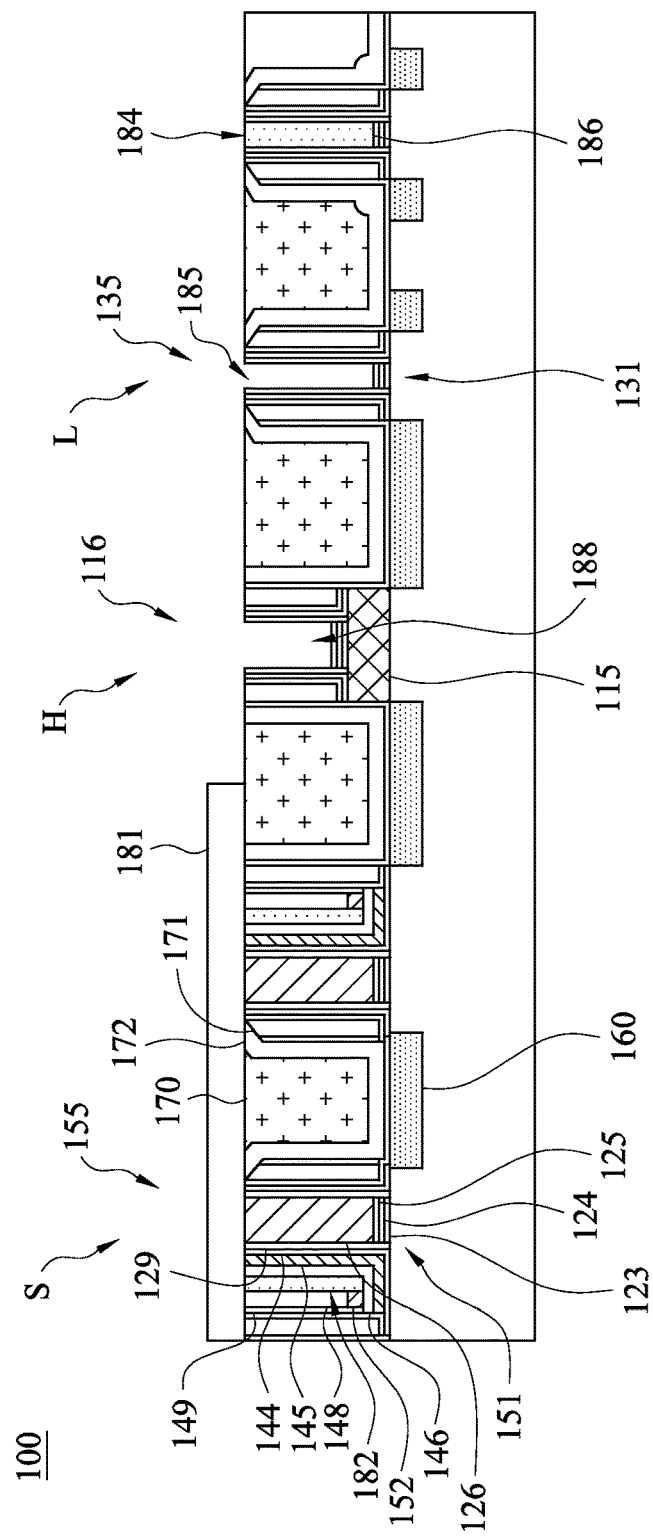

As shown in FIG. 37, a N-metal replacement mask 181 is formed on or above the semiconductor device 100 of FIG. 37. The dummy gate layer 126 of the other logic devices 135 and the dummy gate layer 126 of the high voltage device 116 are exposed by the P-metal replacement mask 181. The dummy gate layer 126 of the other logic devices 135 and the dummy gate layer 126 of the high voltage device 116 are removed to form at least one N-type logic gate opening 185 in the logic devices 135, specifically the logic gate stacks L and at least one high voltage device gate opening 188 in the high voltage device 116, specifically the high voltage device gate stack H.

Figure 38:
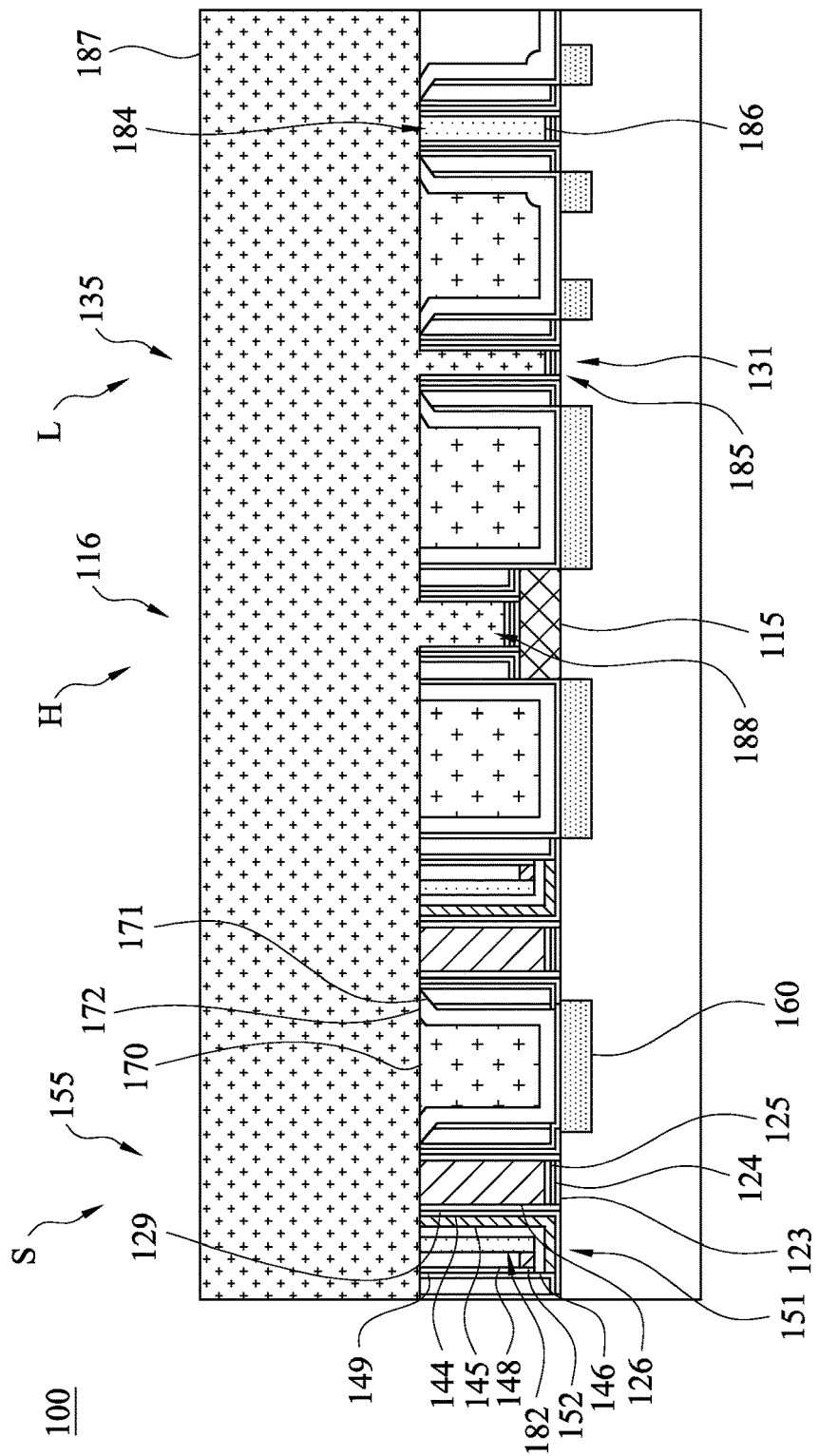
Figure 39:
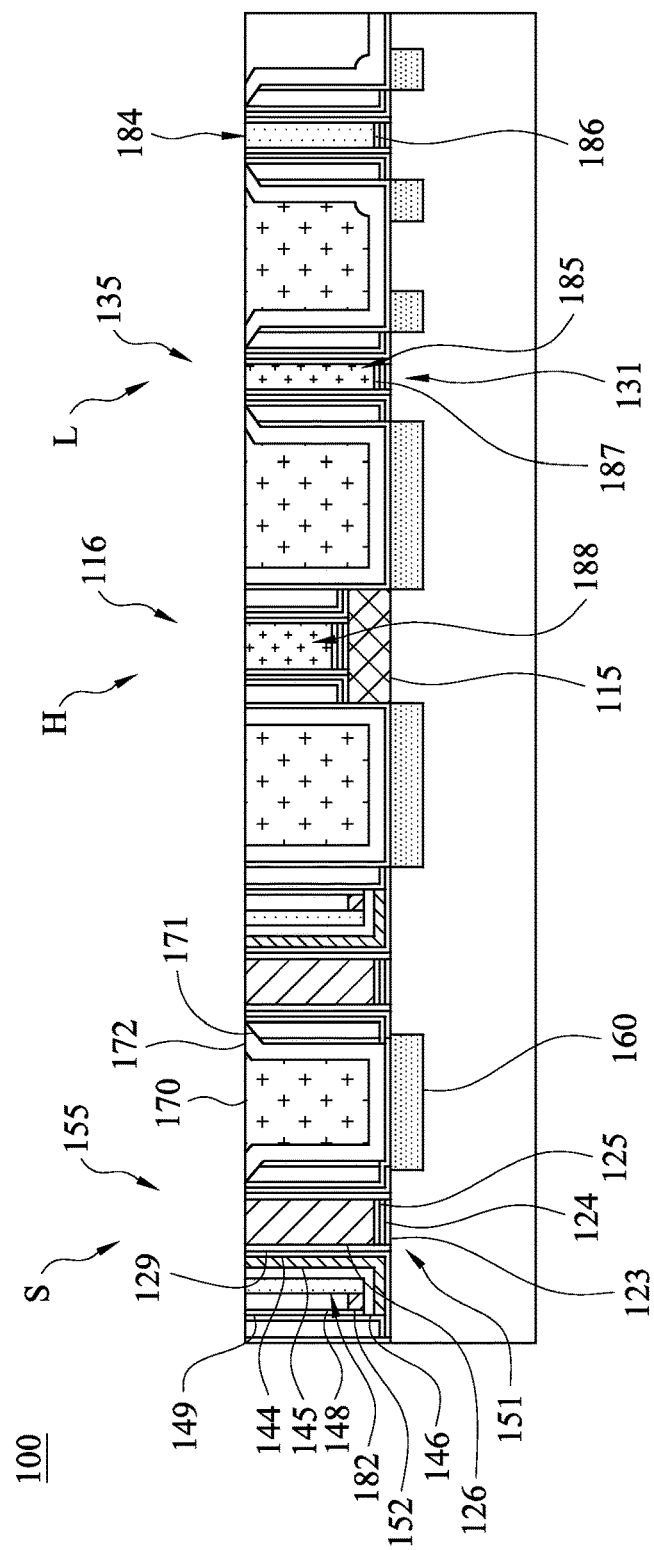

As shown in FIG. 38, N-metal layer 187 is formed on or above the semiconductor device 100, such that the N-type logic gate opening 185 and the high voltage device gate opening 188 are filled with the N-metal layer 187. Then, as shown in FIG. 39, the semiconductor device 100 is planarized, and the N-metal layer 187 outside the N-type logic gate opening 185 and the high voltage device gate opening 188 are removed.

As shown in FIG. 18, FIG. 25, FIG. 32, and FIG. 39, the main gate opening 182 and the select gate opening 183 filled with P-metal layer 186 or N-metal layer 187 can be considered as the metal memory gate, and the P-type logic gate opening 184 and the N-type logic gate opening 185 with P-metal layer 186 or N-metal layer 187 can be considered as the metal logic gate.

Because the split gate memory device 155 and the logic device 135 is formed first, and then the RPG loop is performed, the select gate and the main gate of the split gate memory device 155 and the logic gate of the logic device 135 can be replaced with the metal memory gate and the metal logic gate by using the same mask. Therefore, the masks used in the manufacturing method are reduced, and the cost of the manufacturing method can be reduced.

Because the split gate memory device 155 and the logic device 135 can be formed in the same steps, dummy structure disposed between the split gate memory device 155 and the logic device 135 is not needed and thus can be removed. Therefore, the space use efficiency can be enhanced, and the combination of the split gate memory device 155 and the logic device 135 can be further miniaturized.

According to some embodiments, a method for manufacturing the semiconductor device 100 is provided. The manufacturing acts are described in the followings. At least one split gate memory device 155 and at least one logic device 135 are formed. Then an RPG loop is performed. Specifically, at least one of a select gate and a main gate of a split gate memory device 155 and a logic gate of a logic device 135 are respectively replaced with at least one metal memory gate and a metal logic gate. The other of the select gate and the main gate of the split gate memory device are reserved.

According to some embodiments, in the forming act, at least one pMOSFET is formed as the logic device 135. In the replacing act, the select gate of the split gate memory device 155 and the logic gate of the logic device 135 are respectively replaced with a P-metal select gate and a P-metal logic gate.

According to some embodiments, in the forming act, at least one pMOSFET is formed as the logic device 135. In the replacing act, the main gate of the split gate memory device 155 and the logic gate of the logic device 135 are respectively replaced with a P-metal select gate and a P-metal logic gate.

According to some embodiments, in the forming act, at least one nMOSFET is formed as the logic device 135. In the replacing act, the select gate of the split gate memory device 155 and the logic gate of the logic device 135 are respectively replaced with a P-metal select gate and a P-metal logic gate.

According to some embodiments, in the forming act, at least one nMOSFET is formed as the logic device 135. In the replacing act, the main gate of the split gate memory device 155 and the logic gate of the logic device 135 are respectively replaced with a P-metal select gate and a P-metal logic gate.

According to some embodiments, in the forming act, at least one high voltage device 116 is formed as the logic device 135.

According to some embodiments, in the forming act, at least one high-κ dielectric layer 124 is formed as a select gate dielectric layer of the split gate memory device 155.

According to some embodiments, in the forming act, at least one high-κ dielectric layer 124 is formed as a gate dielectric layer of the logic device 135.

According to some embodiments, another method for manufacturing the semiconductor device 100 is provided. The manufacturing acts are described in the followings. As shown in FIG. 11, at least one split gate stack S with a select gate and a main gate therein is formed on a memory channel 151, and at least one logic gate stack L with a logic gate therein is formed on a logic channel 131. Then an RPG loop is performed. Specifically, first at least one of the select gate and the main gate and the logic gate are removed to form at least one memory gate opening in the split gate stack S and a logic gate opening in the logic gate stack L. The other gate in the split gate stack are reserved. Then at least one metal memory gate in the memory gate opening and at least one metal logic gate in the logic gate opening are formed.

More specifically, the memory gate opening can be main gate opening 182 or select gate opening 183. The logic gate opening can be the P-type logic gate opening 184 or the N-type logic gate opening 185. The P-metal layer 186 or the N-metal layer 187 in the memory gate opening can be considered a metal memory gate. The P-metal layer 186 or the N-metal layer 187 in the logic gate opening can be considered a metal logic gate.

According to some embodiments, the metal memory gate and the metal logic gate are both made of P-metal.

According to some embodiments, the metal memory gate and the metal logic gate are both made of N-metal.

As shown in FIG. 18, FIG. 25, FIG. 32 or FIG. 39, the semiconductor device 100 includes a substrate 110, at least one split gate memory device 155, and at least one logic device 135. The split gate memory device 155 is disposed on the substrate 110. The logic device 135 is disposed on the substrate 110. At least one of a select gate and a main gate of the split gate memory device 155 and a logic gate of the logic device 135 are both made of metal. The other gate of the split gate memory device 155 is made of nonmetal.

According to some embodiments, as shown in FIG. 25, the logic device 135 is a pMOSFET, and the select gate of the split gate memory device 155 and the logic gate of the logic device 135 are both made of P-metal.

According to some embodiments, as shown in FIG. 39, the logic device 135 is a pMOSFET, and the main gate of the split gate memory device 155 and the logic gate of the logic device 135 are both made of P-metal.

According to some embodiments, as shown in FIG. 18, the logic device 135 is a nMOSFET, and the select gate of the split gate memory device 155 and the logic gate of the logic device 135 are both made of N-metal.

According to some embodiments, as shown in FIG. 32, the logic device 135 is a nMOSFET, and the main gate of the split gate memory device 155 and the logic gate of the logic device 135 are both made of N-metal.

According to some embodiments, the logic device 135 is a high voltage device 116.

According to some embodiments, a select gate dielectric layer of the split gate memory device 155 is made of a high-κ dielectric.

According to some embodiments, a logic gate dielectric layer of the logic device 135 is made of a high-κ dielectric.

According to some embodiments, as shown in FIG. 18, FIG. 25, FIG. 32 or FIG. 39, the split gate memory device 155 includes a source region, a drain region, a channel region, and a split gate stack S. The source region is disposed in the substrate 110. The drain region is disposed in the substrate 110. The channel region disposed in the substrate 110 and between the source region and the drain region. The split gate stack S is disposed above the channel region.

Specifically, the drains 160 can be considered as the source region or the drain region. The memory channel 151 can be considered as the channel region.

Specifically, the split gate stack S includes the select gate, a select gate dielectric layer, the main gate, a charge trapping layer 145, a tunneling layer 144, and a blocking layer 146. The select gate is disposed above a first part of the channel region. The select gate dielectric layer is disposed between the select gate and the first part of the channel region. The main gate disposed above a second part of the channel region. The charge trapping layer 145 is disposed between the main gate and the second part of the channel region and further between the main gate and the select gate. The tunneling layer 144 is disposed between the charge trapping layer 145 and the second part of the channel region and further between charge trapping layer 145 and the select gate. The blocking layer 146 is disposed between the charge trapping layer 145 and the main gate.

More specifically, as shown in FIG. 32 or FIG. 39, the split gate stack S further includes a silicon residue 152. The silicon residue 152 is disposed on the blocking layer 146 and adjacent to a surface of the main gate facing away from the select gate.

According to some embodiments, as shown in FIG. 18, FIG. 25, FIG. 32, or FIG. 39, the logic device 135 includes a source region, a drain region, a channel region, and a logic gate stack L. The source region is disposed in the substrate 110. The drain region is disposed in the substrate 110. The channel region disposed in the substrate 110 and between the source region and the drain region. The split gate stack S is disposed above the channel region.

Specifically, the drains 160 can be considered as the source region or the drain region. The logic channel 131 can be considered as the channel region.

Specifically, the logic gate stack L includes the logic gate and a logic gate dielectric layer. The logic gate is disposed above the channel region. The logic gate dielectric layer is disposed between the logic gate and the channel region.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A semiconductor device, comprising:
    a substrate;
    at least one split gate memory device disposed on the substrate;
    at least one first logic device disposed on the substrate; and
    at least one second logic device disposed on the substrate, wherein a select gate of the split gate memory device and a logic gate of the first logic device are both made of one of P-metal and N-metal, a main gate of the split gate memory device is made of nonmetal, a logic gate of the second logic device is made of the other one of P-metal and N-metal, the main gate of the split gate memory device has a flat top surface, the split gate memory device comprises a spacer on a sidewall of the main gate of the split gate memory device and a blocking layer between the main gate and the select gate of the split gate memory device, at least a portion of the main gate of the split gate memory device is between the spacer and the select gate of the split gate memory device, and the flat top surface of the main gate of the split gate memory device is substantially level with a top surface of the spacer of the split gate memory device and a top surface of the select gate of the split gate memory device,
    wherein a lowermost surface of the spacer is above a lowermost surface of the main gate, and the lowermost surface of the main gate is above a lowermost surface of the blocking layer.

2. The semiconductor device of claim 1, wherein the first logic device is a pMOSFET, and the select gate of the split gate memory device and the logic gate of the first logic device are both made of P-metal.

3. The semiconductor device of claim 1, wherein the second logic device is a pMOSFET, and the logic gate of the second logic device is made of P-metal.

4. The semiconductor device of claim 1, wherein the first logic device is an nMOSFET, and the select gate of the split gate memory device and the logic gate of the first logic device are both made of N-metal.

5. The semiconductor device of claim 1, wherein the second logic device is an nMOSFET, and the logic gate of the second logic device is made of N-metal.

6. The semiconductor device of claim 1, wherein the first logic device is a high voltage device.

7. The semiconductor device of claim 1, wherein a select gate dielectric layer of the split gate memory device is made of a high-K dielectric.

8. The semiconductor device of claim 1, wherein a logic gate dielectric layer of the first logic device is made of a high-K dielectric.

9. The semiconductor device of claim 1, wherein the split gate memory device comprises:
    a source region in the substrate;
    a drain region in the substrate;
    a channel region in the substrate and between the source region and the drain region;
    the select gate disposed above a first part of the channel region;
    a select gate dielectric layer disposed between the select gate and the first part of the channel region;
    the main gate disposed above a second part of the channel region;
    a charge trapping layer disposed between the main gate and the second part of the channel region and further between the main gate and the select gate, wherein the blocking layer is disposed between the charge trapping layer and the main gate; and
    a tunneling layer disposed between the charge trapping layer and the second part of the channel region and further between the charge trapping layer and the select gate.

10. The semiconductor device of claim 1, wherein a logic gate dielectric layer of the second logic device includes a high-K dielectric.

11. The semiconductor device of claim 1, wherein the first logic device is a high voltage device, and the select gate of the split gate memory device and the logic gate of the first logic device are both made of N-metal.

12. The semiconductor device of claim 1, wherein the second logic device is a high voltage device, and the logic gate of the second logic device is made of N-metal.

13. The semiconductor device of claim 1, wherein the first logic device is a high voltage device, and a gate dielectric layer of the high voltage device includes a high-κ dielectric.

14. The semiconductor device of claim 1, wherein the second logic device is a high voltage device.

15. A semiconductor device, comprising:
   a substrate; and
   at least one memory device, the memory device comprising:
      a source region disposed in the substrate;
      a drain region disposed in the substrate;
      a channel region disposed in the substrate and between the source region and the drain region;
      a select gate disposed above a first part of the channel region;
      a select gate dielectric layer disposed between the select gate and the first part of the channel region;
      a metal main gate disposed above a second part of the channel region;
      a charge trapping layer disposed between the metal main gate and the second part of the channel region and further between the metal main gate and the select gate;
      a tunneling layer disposed between the charge trapping layer and the second part of the channel region and further between the charge trapping layer and the select gate;
      a blocking layer disposed between the charge trapping layer and the metal main gate;
      a silicon residue disposed on the blocking layer and adjacent to a surface of the metal main gate facing away from the select gate, wherein the blocking layer has a portion under a bottom end of the silicon residue, and the silicon residue is in direct contact with the blocking layer; and
      a spacer above the silicon residue, wherein the spacer and the silicon residue have an interface therebetween.

16. The semiconductor device of claim 15, wherein the metal main gate of the memory device is made of P-metal.

17. The semiconductor device of claim 15, wherein the metal main gate of the memory device is made of N-metal.

18. A semiconductor device, comprising:
   a substrate;
   at least one split gate memory device disposed on the substrate;
   at least one logic device disposed on the substrate, wherein a logic gate of the logic device and a main gate of the split gate memory device are both made of one of P-metal and N-metal, and a select gate of the split gate memory device is made of nonmetal;
   a silicon residue present on at least one sidewall of the main gate of the split gate memory device facing away from the select gate of the split gate memory device; and
   a seal layer, wherein the silicon residue is between the main gate and the seal layer, and a flat bottom surface of the silicon residue, a bottom surface of the seal layer, and the main gate of the split gate memory device are in direct contact with a blocking layer of the split gate memory device.

19. The semiconductor device of claim 18, wherein the logic device is a pMOSFET, and the main gate of the split gate memory device and the logic gate of the logic device are both made of P-metal.

20. The semiconductor device of claim 18, wherein the logic device is an nMOSFET, wherein the main gate of the split gate memory device and the logic gate of the logic device are both made of N-metal.

* * * * *